United States Patent
Ma

(10) Patent No.: US 11,447,856 B2
(45) Date of Patent: Sep. 20, 2022

(54) METHOD FOR COATING STAINLESS STEEL PRESS PLATES AND COATED PRESS PLATES PRODUCED THEREBY

(71) Applicant: Wilsonart LLC, Austin, TX (US)

(72) Inventor: Muyuan M. Ma, Austin, TX (US)

(73) Assignee: WILSONART LLC, Austin, TX (US)

( * ) Notice: Subject to any disclaimer, the term of this patent is extended or adjusted under 35 U.S.C. 154(b) by 0 days.

(21) Appl. No.: 16/902,594

(22) Filed: Jun. 16, 2020

(65) Prior Publication Data

US 2020/0308690 A1  Oct. 1, 2020

Related U.S. Application Data

(62) Division of application No. 15/426,439, filed on Feb. 7, 2017, now Pat. No. 10,718,047.

(60) Provisional application No. 62/293,032, filed on Feb. 9, 2016.

(51) Int. Cl.

| | |
|---|---|
| *B32B 15/00* | (2006.01) |
| *C23C 14/06* | (2006.01) |
| *B32B 37/00* | (2006.01) |
| *B30B 15/06* | (2006.01) |
| *C23C 14/02* | (2006.01) |
| *C23C 14/35* | (2006.01) |
| *B32B 15/01* | (2006.01) |

(52) U.S. Cl.
CPC ........ *C23C 14/0688* (2013.01); *B30B 15/062* (2013.01); *B32B 15/00* (2013.01); *B32B 15/01* (2013.01); *B32B 15/012* (2013.01); *B32B 37/0046* (2013.01); *C23C 14/025* (2013.01); *C23C 14/067* (2013.01); *C23C 14/352* (2013.01)

(58) Field of Classification Search
CPC . B30B 15/062; C32C 14/067; C32C 14/0688; B32B 15/00; B32B 15/012
USPC .......................... 428/386, 615, 628, 650, 655
See application file for complete search history.

(56) References Cited

U.S. PATENT DOCUMENTS 6,656,329 B1 * 12/2003 Ma ........................ C23C 14/067
  204/192.1
2004/0209125 A1 * 10/2004 Yamamoto .............. C23C 28/00
  428/698

OTHER PUBLICATIONS

Monclus, "Nanostructural studies of PVD TiAlB coating," Surface and Interface Analysis, 731-735, 2006. (Year: 2006).*
Rebholz, "Structure, hardness and mechanical properties," Surface and Coatings Technologies, 412-417, 1999. (Year: 1999).*

* cited by examiner

*Primary Examiner* — Matthew D Matzek
(74) *Attorney, Agent, or Firm* — Welsh Flaxman & Gitler LLC

(57) ABSTRACT

A method for coating stainless steel press plates includes preparing the stainless steel press plate for coating and coating the stainless steel press plate with a diboride doped with 1%-5% by weight aluminum to produce a diboride-aluminum coating. The step of coating includes applying the diboride-aluminum coating to a stainless steel press plate using a magnetron sputter coating system.

12 Claims, 48 Drawing Sheets

Surface morphology of $TiB_2$-Al films on Si Substrate

Surface morphology of TiB$_2$-Al films on SS Substrate

| TBA5 (30min) | TBA7 (15min) | TBA10 (15min) | TBA15 (15min) | TBA20 (15min) | TBA25 (10min) | TBA50 (10min) | TBA100 (10min) |

Film thickness: 1450nm

FIG. 27

METHOD FOR COATING STAINLESS STEEL PRESS PLATES AND COATED PRESS PLATES PRODUCED THEREBY

CROSS REFERENCE TO RELATED APPLICATION

This application is a division of U.S. patent application Ser. No. 15/426,439, entitled "METHOD FOR COATING STAINLESS STEEL PRESS PLATES AND COATED PRESS PLATES PRODUCED THEREBY, Feb. 7, 2017, which claims the benefit of U.S. Provisional Application Ser. No. 62/293,032, entitled "METHOD FOR COATING STAINLESS STEEL PRESS PLATES AND COATED PRESS PLATES PRODUCED THEREBY," filed Feb. 9, 2016.

BACKGROUND OF THE INVENTION

1. Field of the Invention

This invention relates to coated, abrasion resistant press plates used in making abrasion resistant decorative laminate, coating of press plates and making laminate with these press plates. Grit, e.g., alumina particles, on the pressing surface of abrasion resistant decorative laminate can scratch press plates and reduce the visual quality of laminate thereafter made with the press plate. Press plates of this invention are particularly useful in making abrasion resistant high gloss decorative laminate.

2. Description of the Related Art

In the manufacture of decorative laminate, layers of resin impregnated paper are pressed against press plates under conditions of temperature and pressure to cure the resin and bond the layers together. A high gloss press plate imparts a high gloss surface to laminate. A press plate with a textured surface will impart a textured surface to laminate. These press plates are extremely uniform, with even microscopic discontinuities being minimized. The quality of a high gloss polished press plate can be determined by viewing reflected images on its surface and scrutinizing the reflected images for optical discrepancies. Grit is often applied to laminates in an effort to improve wear characteristics. The grit on the surface of laminate causes micro scratching of stainless steel press plates normally used in the manufacture of decorative laminate, thus destroying the micro finish of the press plate. Press plates can also be scratched by press plate handling equipment and by debris from pressing equipment or materials used in making laminate. See Laurence U.S. Pat. No. 5,244,375.

Melamine resin coated decorative laminates are pressed at temperatures of about 230° F.-310° F. (110° C.-155° C.) and pressures of about 300-2000 psi (20-136 bar) and preferably about 750-1500 psi (51-102 bar). Heating to these temperatures and cooling to room temperature results in substantial expansion and contraction of the laminate and of the press plate. Expansion and contraction of the laminate and press plate will not be the same, resulting in the movement of grit on the pressing surface of laminate across the press plate.

It is disclosed in National Electrical Manufacturers Association (NEMA) Standards Publication No. LD 3, that gloss finish laminate has a gloss of 70-100+. High gloss textured finish laminate is disclosed as having a gloss of 21-40. Black glass with a gloss of 94+1, measured at an angle of 60 degrees, is disclosed as the NEMA Standard 3.2.2, for calibrating a gloss meter for 60 degree angle gloss measurements.

Even discontinuities in high gloss press plates that can only be seen with a microscope can impart visible surface defects to a high gloss surface of laminate. Any scratching of high gloss press plates imparts visible surface defects to high gloss surfaces of laminate and reduces gloss level.

Grit on the decorative surface of laminate imparts abrasion resistance, a commercially desirable characteristic of laminate. Particles of alumina are commonly used as grit in making decorative laminate. The Vickers hardness of alumina is disclosed in "Tribology: Friction and wear of Engineering Materials", I. M. Hutchings, CRC Press, 1992, to be 1800 HV (Vickers Pyramid Number) to 2000 HV. A useful range of particle sizes is about 10 microns to about 75 microns. Grit of about 25 microns to 60 microns is preferred. Optimum abrasion resistance is obtained in the particle size range of about 40 microns to 60 microns. See Lane et al. U.S. Pat. No. 3,798,111.

Alumina having a maximum particle size of 9 microns is disclosed as being effective for imparting a wear resistant surface to glossy decorative laminate. Wear resistance is defined as the resistance of a glossy laminate to loss of gloss when the surface of laminate is exposed to the abrasive effects of sliding objects. It is acknowledged that the resulting laminate does not meet NEMA LD 3.13 requirements to be considered as abrasion resistant. However, it is disclosed that glossy press plates are not scratched substantially if the grit particle size is maintained at less than 9 microns. See Lex et al. U.S. Pat. No. 4,971,855.

The use of a 410 stainless steel press plate hardened by nitriding is disclosed for making high gloss decorative laminate. After pressing 100 sheets of high gloss laminate with 6 micron grit and 15 micron grit, the gloss of the pressed laminate remained good to very good. The nitrided press plate exposed to the 6 micron grit was rebuffed after 234 cycles and produced acceptable laminate quality for at least another 103 cycles. Nitrided press plates exposed to 30 micron grit offered limited durability. It is disclosed that the 410 stainless steel press plate used for nitrating had a Rockwell, "C" scale hardness of 38-45 and that the nitrided surface had a Rockwell, "C" scale hardness of 60-70. The equivalent Vickers hardness of 410 stainless steel is about 370-440 HV, based on a conversion table published in "Metals Handbook, Mechanical Testing", Vol 8, 9th ed., ASM, 1985. The equivalent Vickers hardness of nitrided 410 stainless steel is about 500-1000 HV, based on a conversion table published in "Metals Handbook, Mechanical Testing", Vol. 8, 9th ed., ASM, 1985. See Laurence U.S. Pat. No. 5,244,375.

Laminate with alumina at its surface has been pressed with high gloss press plates coated with titanium nitride. After ten pressings, the titanium nitride coated press plates had about 15 scratches per square centimeter. A control 410 stainless steel press plate had about 500 scratches per square centimeter.

The control press plate and the press plate on which the titanium nitride was coated were cut from the same stainless steel pressing plate. The scratches were visible under a light microscope at 40× magnification. Titanium nitride was coated onto 410 stainless steel high gloss press plates in a magnetron sputter coating system.

There is a need for a hard coating on press plates, continuous belts, and other pressing surfaces that imparts a color to laminate having an ASTM D 2244 color difference in comparison to a standard of less than (±0.5) ΔE. There is a need for a coating that can be applied to pressing surfaces without changing the appearance of the finish on the pressing surface. There is a need for pressing surfaces that are not scratched when used in pressing laminate coated with alumina particles of greater than 10 microns and preferably greater than 25 microns. There is a particular need for pressing surfaces that are not scratched when used in the manufacture of high gloss laminate with an ASTM 2457 60 degree angle gloss of greater than 70, when the surface of the laminate is coated with 25-60 micron alumina particles.

SUMMARY OF THE INVENTION

It is, therefore, an object of the present invention to provide a method for coating stainless steel press plates. The method includes preparing the stainless steel press plate for coating and coating the stainless steel press plate with a diboride doped with 1%-5% by weight aluminum (Al) to produce a diboride-aluminum (diboride-Al) coating. The step of coating includes applying the diboride-aluminum coating to a stainless steel press plate using a magnetron sputter coating system.

It is also an object of the present invention to provide a method wherein the diboride is titanium diboride ($TiB_2$).

It is another object of the present invention to provide a method wherein the stainless steel press plate is a 410 stainless steel high gloss press plates.

It is a further object of the present invention to provide a method wherein the stainless steel press plate is a 300 stainless steel press plate, a 410 stainless steel press plate, a 420 stainless steel press plate, a 630 stainless steel press plate, or a 633 stainless steel press plate.

It is also an object of the present invention to provide a method wherein the diboride-aluminum coating has a Vickers hardness of at least 35 GPa.

It is another object of the present invention to provide a method wherein the diboride-aluminum coating has a Vickers hardness of 46 GPa.

It is a further object of the present invention to provide a method wherein the diboride-aluminum coating has a thickness of about 3 microns.

It is also an object of the present invention to provide a method wherein the step of coating includes doping the diboride with 2% by weight Al.

It is another object of the present invention to provide a method wherein the step of coating includes applying the diboride-aluminum coating at a substrate bias of 60-90 V and at temperature of 200° C.

It is a further object of the present invention to provide a method wherein the diboride-aluminum coating has a minimum bond strength of 1.6 kilogram force (kgf).

It is also an object of the present invention to provide a method wherein the diboride-aluminum coating has a minimum bond strength of 1.8 kgf.

It is another object of the present invention to provide a method wherein the step of preparing the stainless steel press plate includes cleaning a pressing side of the stainless steel press plate.

It is a further object of the present invention to provide a method wherein the step of preparing the stainless steel press plate includes etching the pressing side of the stainless steel press plate.

It is also an object of the present invention to provide a method wherein the step of preparing the stainless steel press plate includes applying a layer of titanium directly onto the pressing side of the stainless steel press plate It is another object of the present invention to provide a method wherein the step of coating includes applying multiple layers of the diboride-aluminum coating.

It is a further object of the present invention to provide a method wherein the diboride-aluminum coating is applied in a two-stage process composed of a gradient based diboride-aluminum coating layer and top titanium diboride-aluminum coating layer.

It is also an object of the present invention to provide a method wherein the gradient based diboride-aluminum coating layer is 600 nm in thickness.

It is another object of the present invention to provide a method wherein the top titanium diboride-aluminum coating layer is 1,240 nm in thickness.

It is further an object of the present invention to provide a coated stainless steel press plate manufactured in according with the method described above.

Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 27 is a schematic of alternative layered coatings in accordance with Example 2.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

Figure 1:
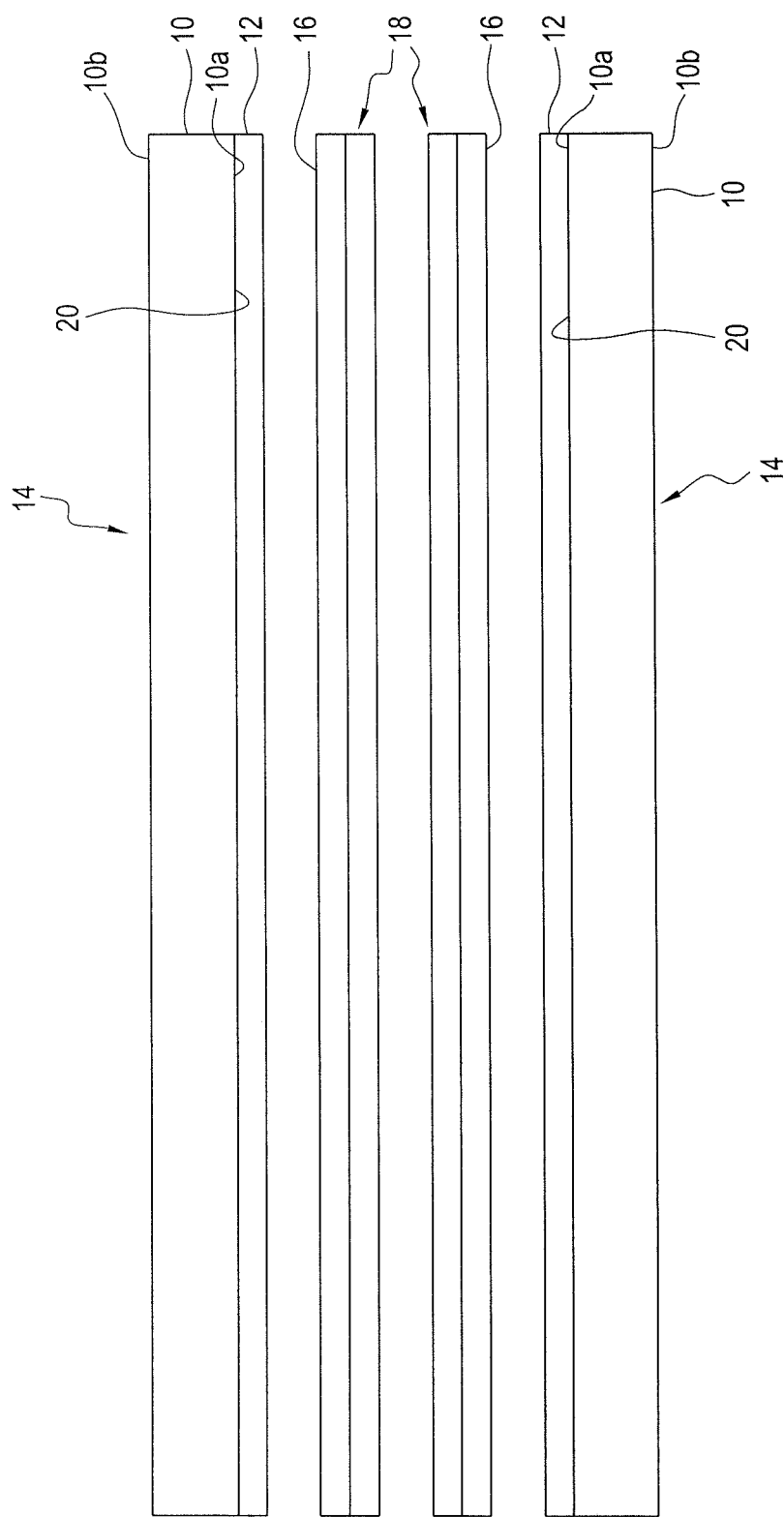
FIG. 1 is a schematic of the present coated press plates used in the manufacture of high pressure decorative laminate.

In accordance with a preferred embodiment, and with reference to FIG. 1, stainless steel press plates 10 are coated with a diboride doped with 1%-5% by weight aluminum (Al) 12 to produce a coated press plate 14 with an aluminum doped diboride-aluminum (diboride-aluminum (Al)) coating 12 used in the manufacture of high pressure decorative laminates. In accordance with the present invention, the hardness of diboride coatings used in the manufacture of stainless steel press plates for the production of high pressure decorative laminates is enhanced by applying the diboride coating to a stainless steel press plate using a magnetron sputter coating system and simultaneously doping the diboride with 1%-5% aluminum (Al).

As those skilled in the art will appreciate, the stainless steel press plates 10 used in accordance with the present invention are sized for the manufacture of decorative laminate sheets and include parallel first and second planar surfaces 10a, 10b. For example, press plates are commonly made in a variety of sizes depending upon the specific application for which the plate is destined. For example, press plates currently used come in 38 inch (96.52 cm), 50 inch (127 cm) and 62 inch (157.48 cm) widths, 7 foot (2.1336 m), 8 foot (2.4384 m), 10 foot (3.048 m), and 12 foot (3.6576 in) lengths and 0.085 inch (0.2159 cm) to 0.250 inch (0.635 cm) thicknesses. While specific dimensions are disclosed herein, the stainless steel press plates may take a variety of forms without departing from the spirit of the present invention.

In accordance with the present invention, the diboride is titanium diboride ($TiB_2$), although it is appreciated it may be possible to achieve results similar to the claimed invention through the use of other diborides known to those skilled in the art to achieve high hardness characteristics when applied to a stainless steel substrate. Titanium diboride is more commonly used commercially for coating surfaces than other diborides, because it can be sputter coated in a magnetron sputtering system at a higher deposition rate.

As for the press plates 10 used in accordance with the present invention, they are preferably 410 stainless steel high gloss press plates, although those skilled in the art will appreciate that 300, 410, 420, 630, and 633 stainless steel press plates have been coated (exhibiting the same enhancement in surface hardness regardless of the substrate) and used in the manufacture of decorative laminates. As such, it is appreciated a variety of stainless steel high gloss press plates may be used within the spirit of the present invention. As for the 410 stainless steel high gloss press plates, and as those skilled in the art will appreciate, 410 stainless steel press plates are 12% chromium martensitic stainless steel plates that can be heat treated to obtain a wide range of mechanical properties. The alloy has good corrosion resistance along with high strength and hardness. By way of example, a 410 stainless steel press plate in accordance with the present invention has the following composition: chromium 11.5%-13.5% by weight; nickel 0.75% by weight; carbon 0.08%-0.15% by weight; manganese 1.0% by weight; phosphorus 0.04% by weight; sulfur 0.03% by weight; silicon 1.0% weight; and iron 83.53%-85.6% by weight.

The aluminum doped titanium diboride coating ($TiB_2$—Al coating) 12 of the present invention is applied on stainless steel press plates 10 used in the production of high pressure laminates. The resulting coated press plates 14 are fabricated with a hardness sufficient for pressing high pressure decorative laminate with 25-60 micron or larger alumina particles at the pressing surface 16 of the high pressure decorative laminate 18 without being scratched. In accordance with the present invention, the $TiB_2$—Al coating 12 (which is also referenced as "TBA" in the figures) when applied to a stainless steel press plate 10 in the manner described below has a Vickers hardness of at least 35 GPa, and preferably 46 GPa. It has been found that a $TiB_2$—Al coating 12 of about 3 microns in thickness has sufficient hardness to resist scratching by alumina particles on the pressing surface 16 of a high pressure decorative laminate 18 during the manufacture of thereof. As will be explained below in greater detail, such a $TiB_2$—Al coating 12 is achieved by doping the $TiB_2$ with Al at approximately 1%-5% by weight Al, and preferably 2% by weight Al, with a substrate bias of 60-90 Volts (V) (as it has been found that use of a substrate bias level of 60-90 V increases film hardness) and at temperature of 200° C. In order to produce such a thickness, a target power of 200 Watts (W)×2 for the $TiB_2$ and 3-15 (preferably 5) W×1 for Al is preferred. It is also preferred that a Ti base layer 22 be applied between the $TiB_2$—Al coating 12 and the stainless steel press plate 10. Further, the $TiB_2$—Al coating 12 has a minimum bond strength of 1.6 kilogram force (kgf) and preferably 1.8 kgf as determined by a diamond stylus scratch tester.

Figure 2:
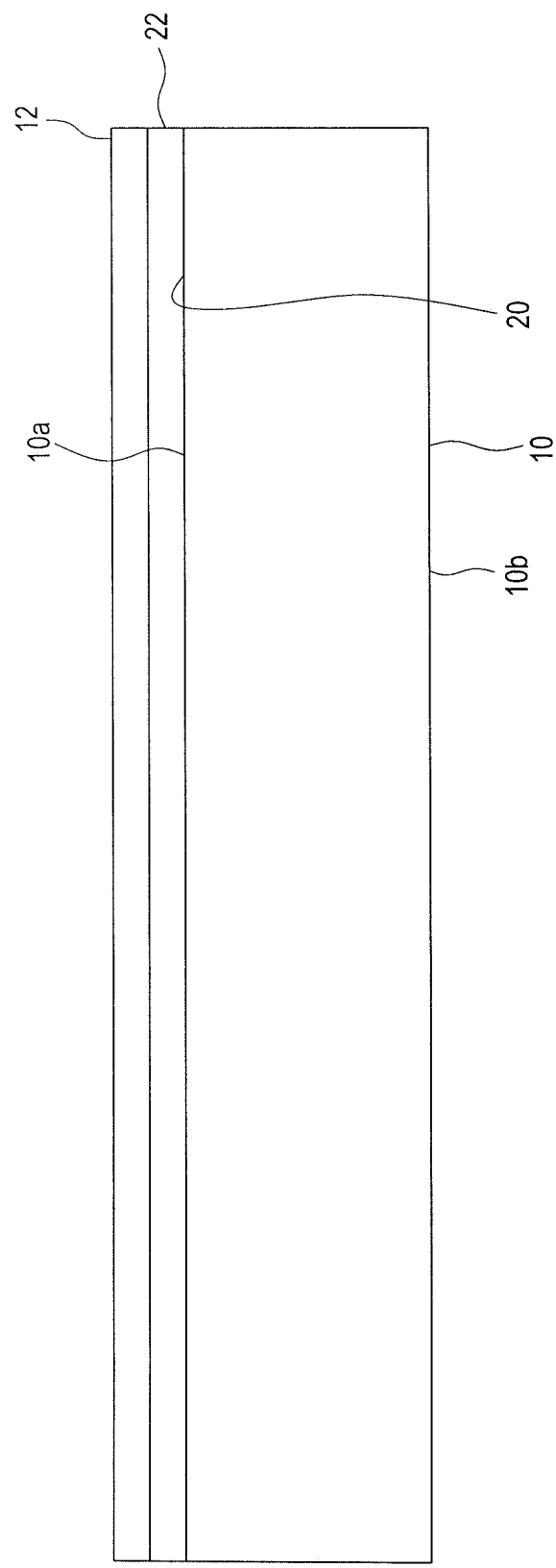
FIG. 2 is a schematic of an embodiment of a coated press plate in accordance with the present invention.

In accordance with each of the examples presented below, bonding of the $TiB_2$—Al coating 12 to the stainless steel press plate 10 is enhanced by thoroughly cleaning the pressing side 20 (that is, the side of the stainless steel press plate 10 that is intended to face the high pressure decorative laminate 18 during the manufacture process and that corresponds to the first planar surface 10a of the present stainless steel press plate 10) of the stainless steel press plate 10 before introducing the pressing side 20 of the stainless steel press plate 10 into a magnetron sputter coating system 100. Bonding is further enhanced by etching the pressing side 20 of the stainless steel press plate 10 prior to applying the $TiB_2$—Al coating 12. Cleaning, anodic etching, cathodic etching and etching with radio frequency (RF) is accomplished by methods known to those skilled in the use of a magnetron sputter coating system. In accordance with one embodiment as shown with reference to FIG. 2, it has been found that a base layer of titanium 22 applied directly onto the pressing side 20 of the stainless steel press plate 10 before applying the $TiB_2$—Al coating 12 of this invention further enhances the bonding of the $TiB_2$—Al coating 12. Improving bonding by cleaning, etching and the use of an intermediate layer between the $TiB_2$—Al coating 12 and the stainless steel press plate 10 are known to those skilled in the art of using magnetron sputter coating systems.

Figure 3:
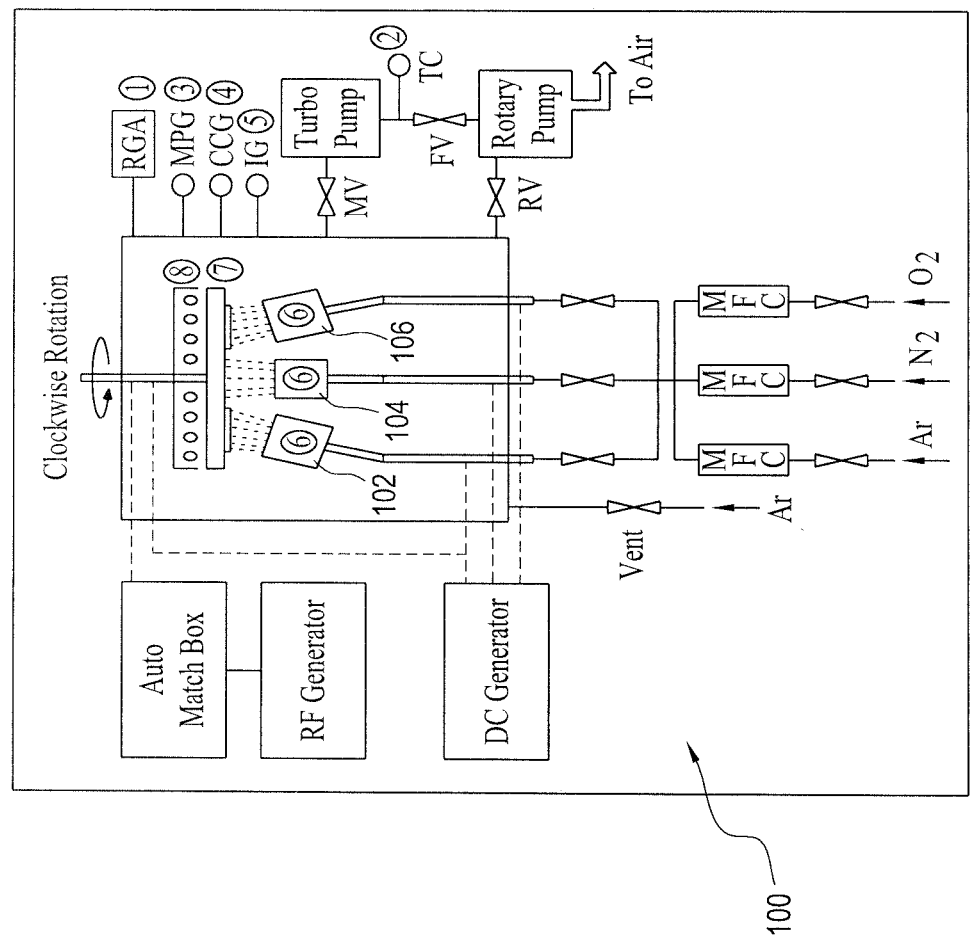
FIG. 3 is a schematic of a magnetron sputter coating system for use in accordance with the present invention.

It will be appreciated by those skilled in the art that magnetron sputter coating systems are well known and the present invention employs a magnetron sputter coating system well known to those skilled in the art. With that in mind, and with reference to FIG. 3 and considering the operating parameters discussed below, it should be appreciated, the magnetron sputter coating system 100 of the present invention employs 3 applicators 102, 104, 106, wherein two applicators 102, 104 are used in applying $TiB_2$ and the other applicator 106 is used in applying the Al. This arrangement is designated below where the Targets are identified as "$TiB_2$×2, Al×1."

Example 1

A $TiB_2$—Al coating was applied via the magnetron sputtering system in accordance with the following conditions (Table 1) with Target Power (DC) for the Al varied to 3 W, 5 W, 7 W, 10 W, 15 W, 20 W, 25 W, 50 W, 100 W, 150 W and 200 W:

TABLE 1

| | |
|---|---|
| Substrate (Sub.) | Silicon (Si)(100), Stainless Steel (SS) |
| Targets | $TiB_2$ × 2, Al × 1 |
| Target power (DC) | $TiB_2$: 200 W × 2 |
| | Al: 3 W, 5 W, 7 W, 10 W, 15 W, 20 W, 25 W, 50 W, 100 W, 150 W, 200 W |
| Substrate bias (RF) | −60 V dc |
| Working Pressure | ($8 \times 10^{-3}$ torr) |
| Reactive gas | Ar (40 sccm (standard cubic centimeter per minute)) |

TABLE 1-continued

| Deposition Time | 2 hrs |
|---|---|
| Substrate Temperature | 200° C. |

Figure 4:
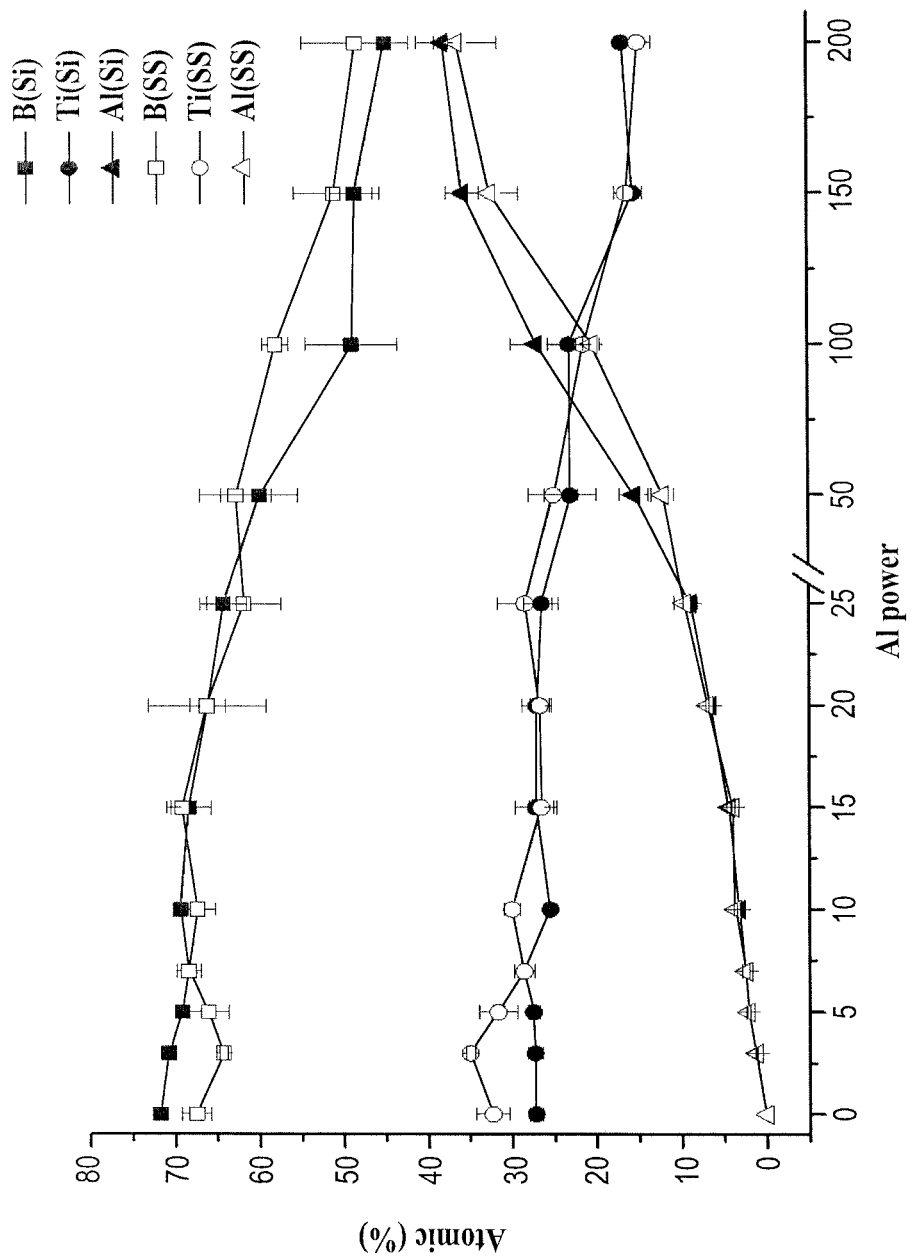
FIGS. 4 to 25 represent test results generated in accordance with Example 1 as discussed below.
Figure 5:
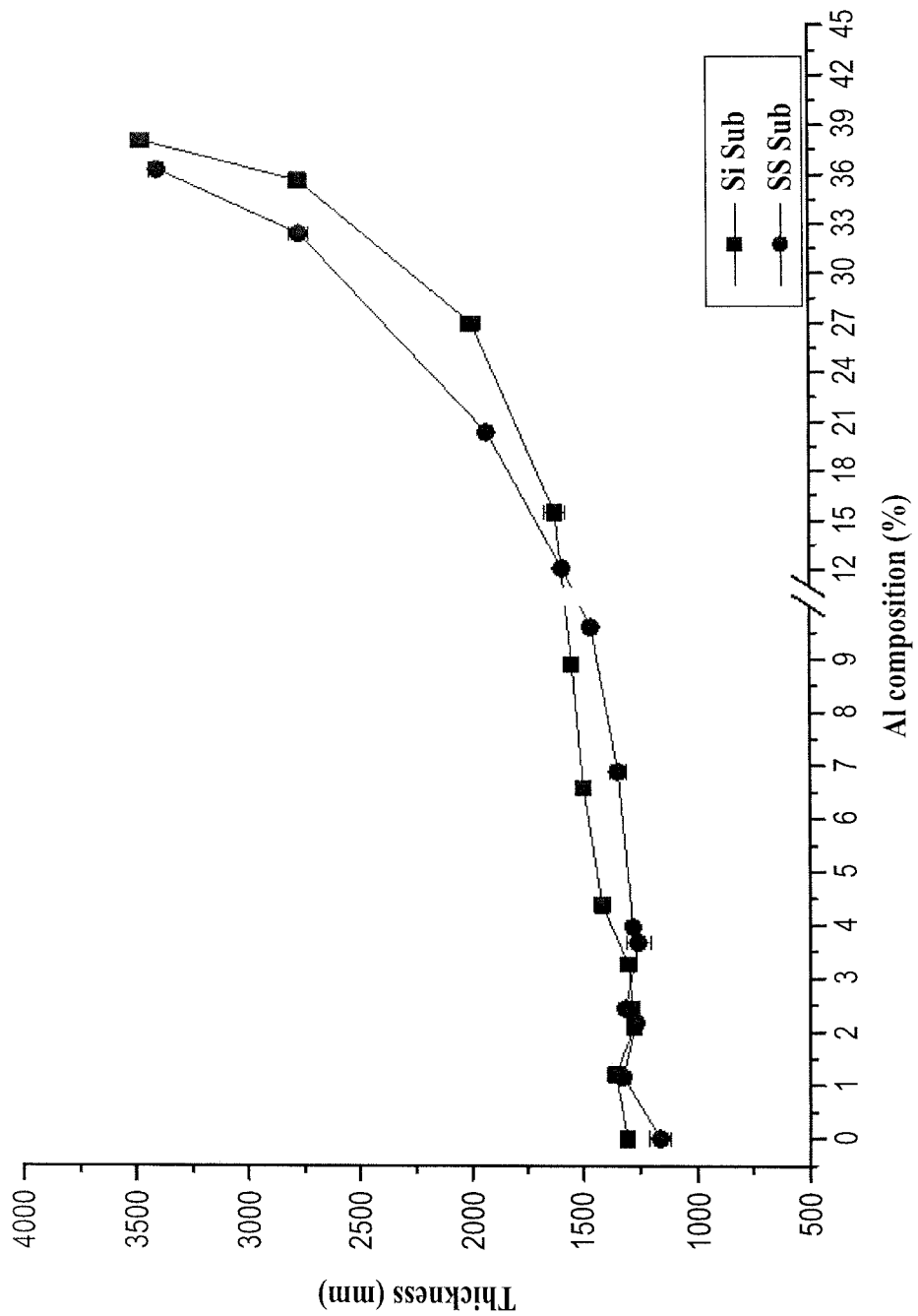
Figure 6:
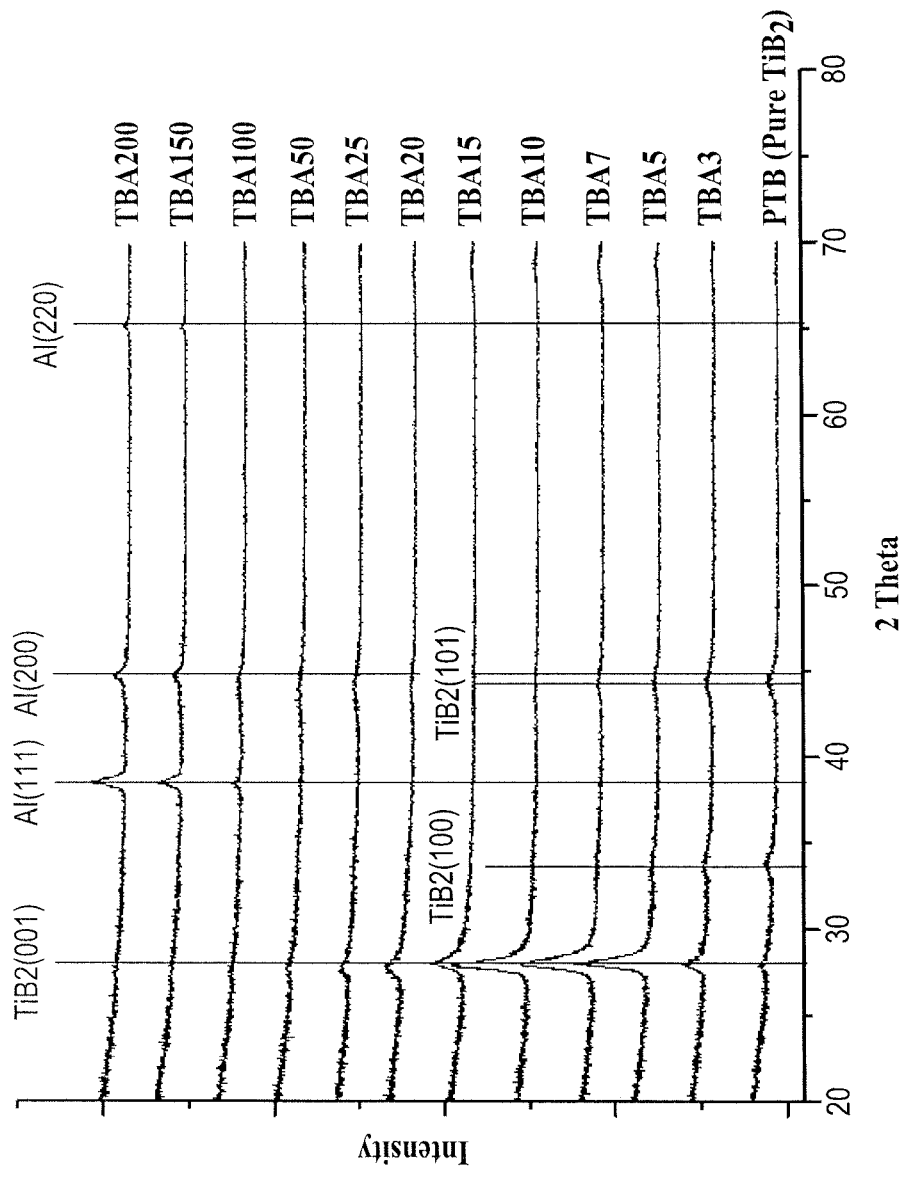
Figure 7:
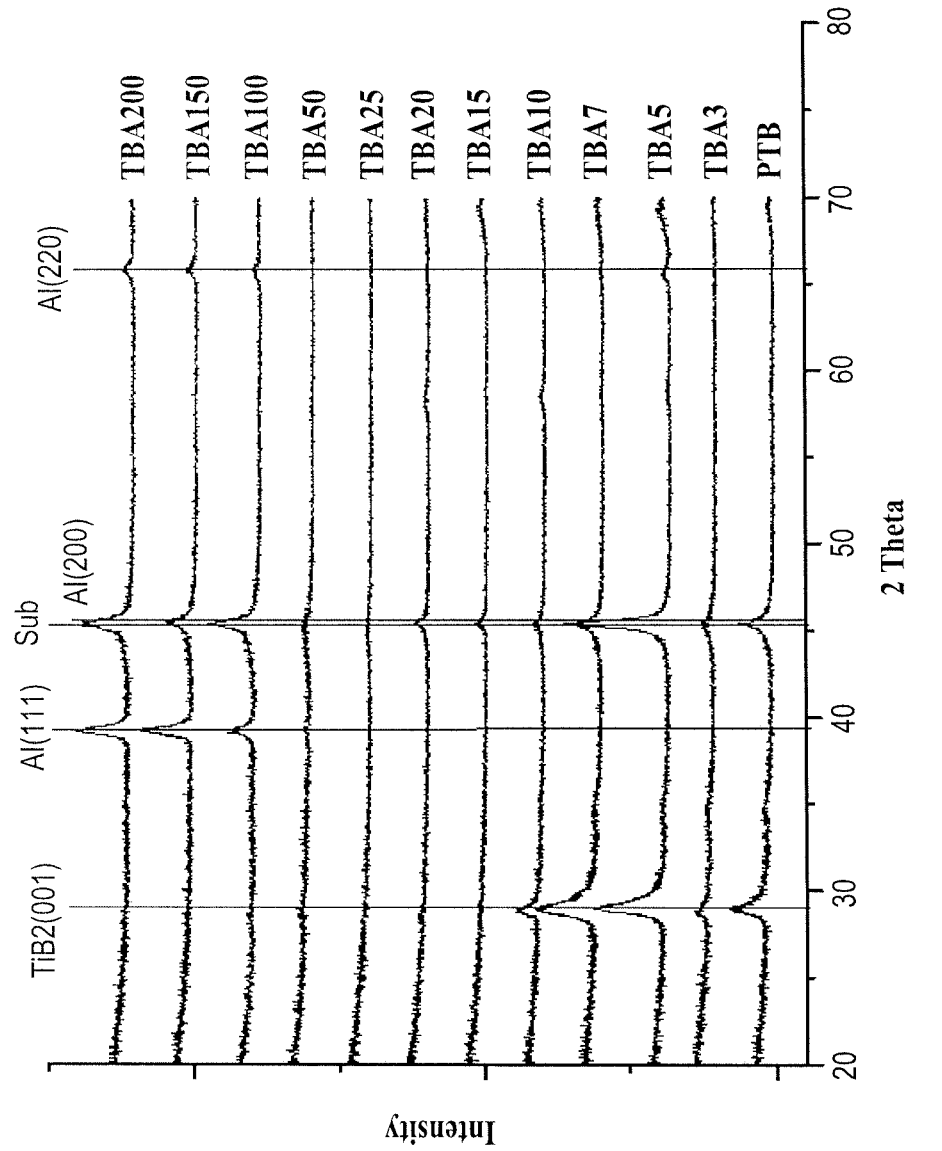
Figure 8:
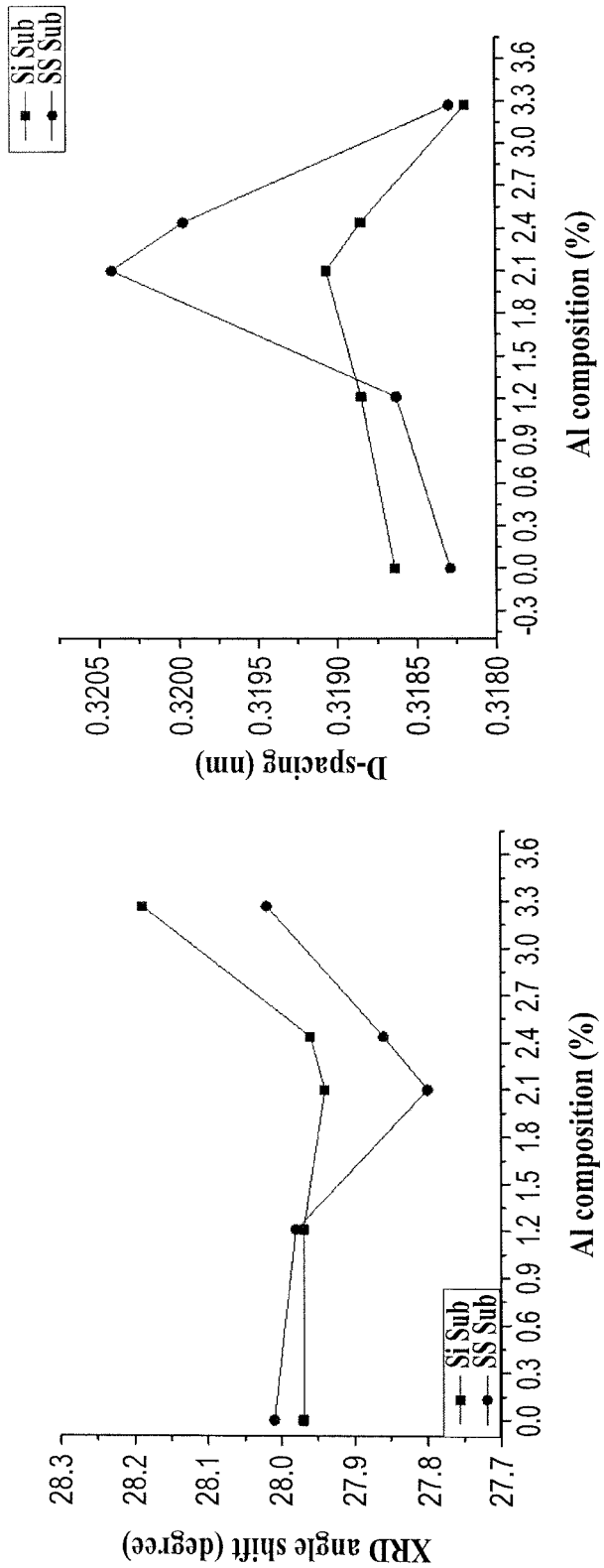
Figure 9:
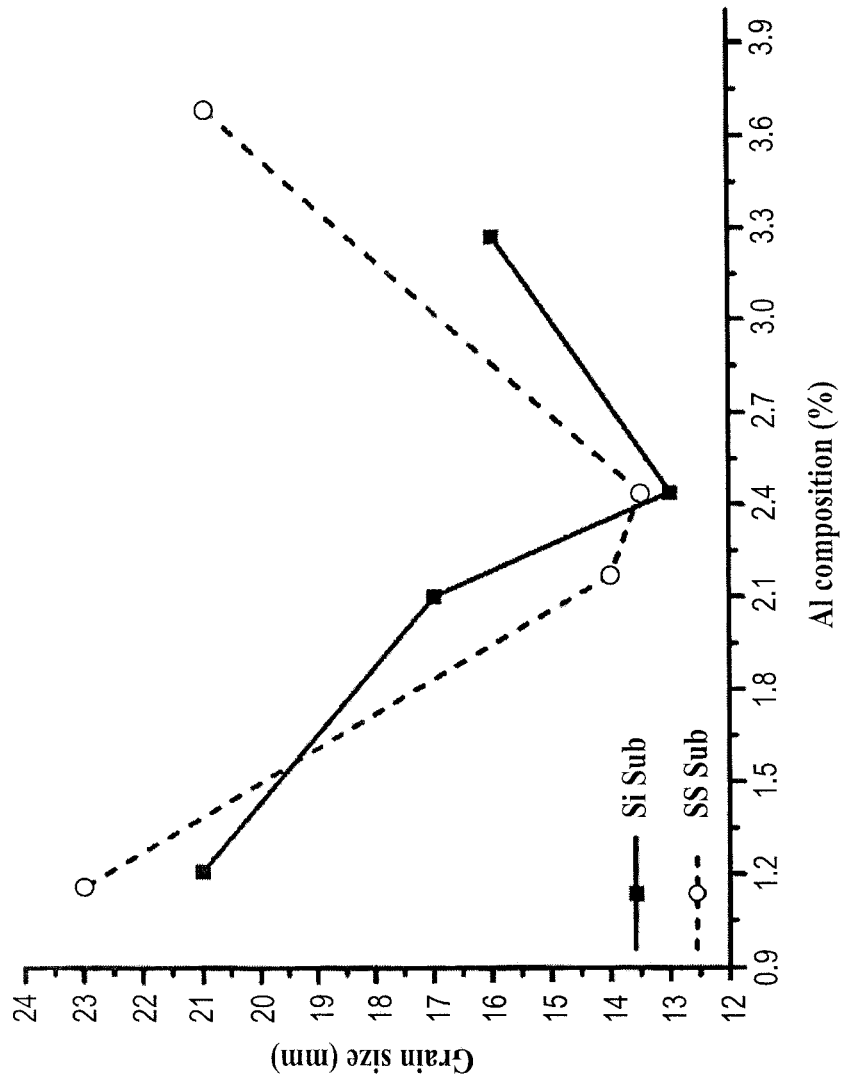
Figure 10:
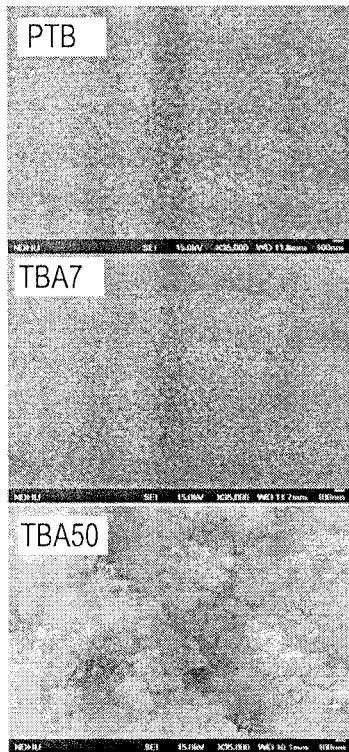
Figure 10:
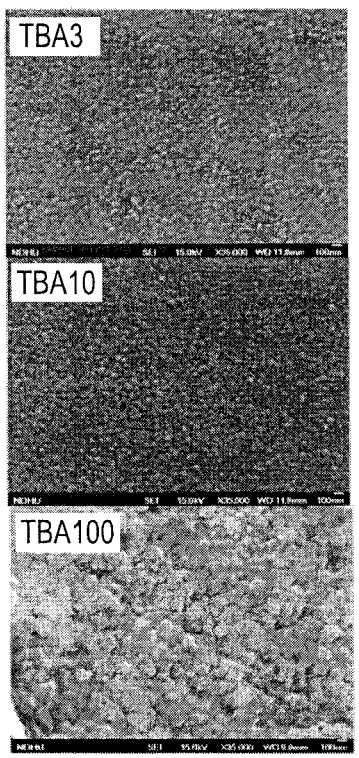
Figure 10:
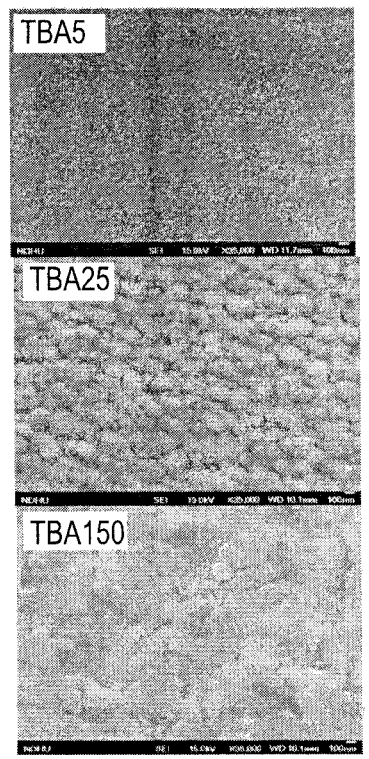
Figure 10:
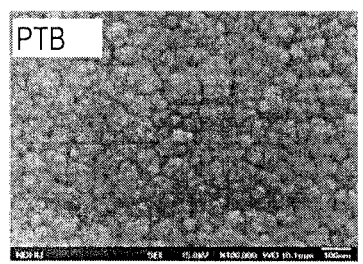
Figure 10:
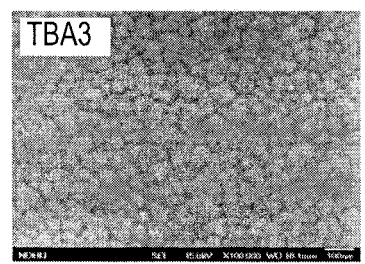
Figure 10:
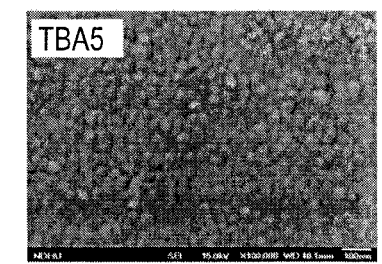
Figure 10:
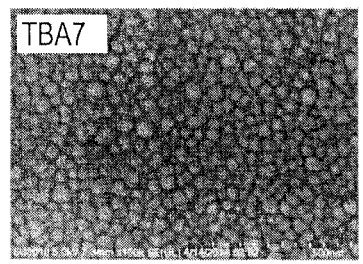
Figure 10:
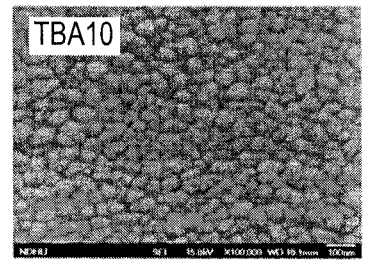
Figure 11:
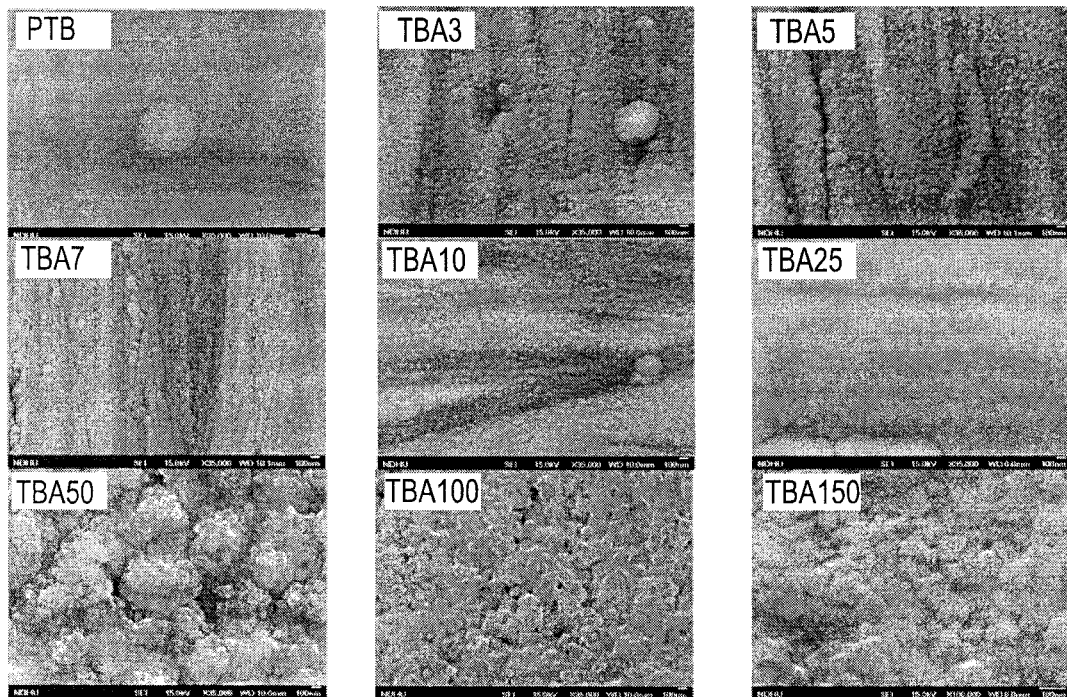
Figure 11:
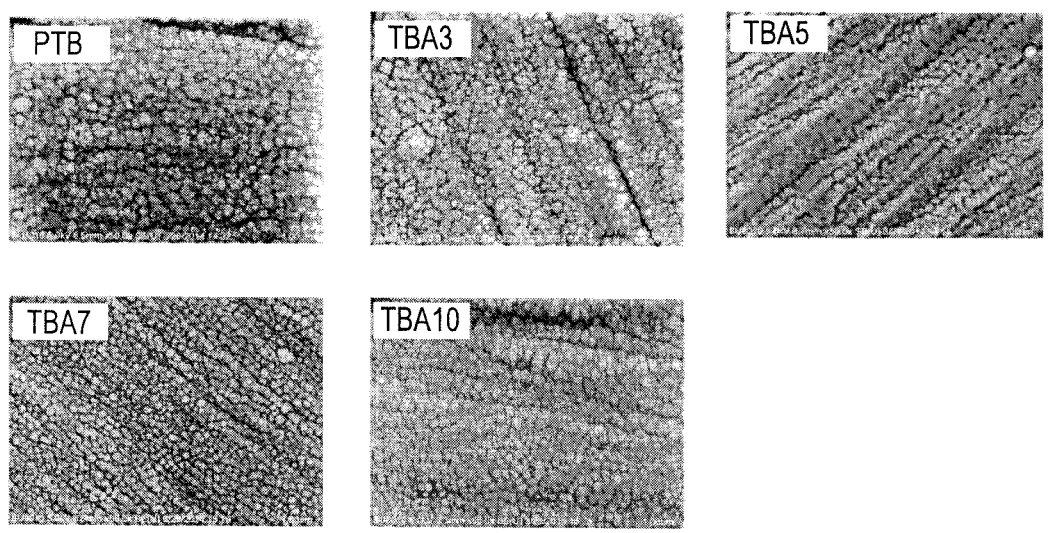
Figure 12:
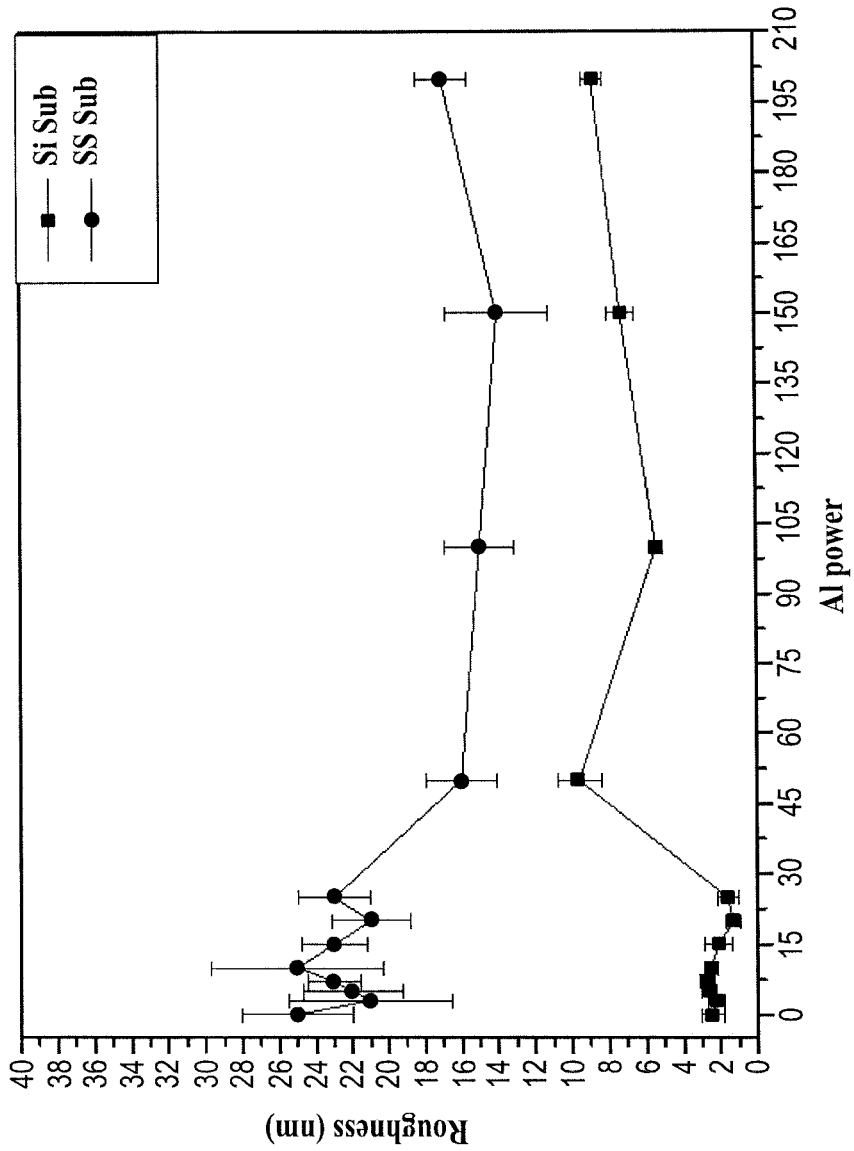
Figure 13:
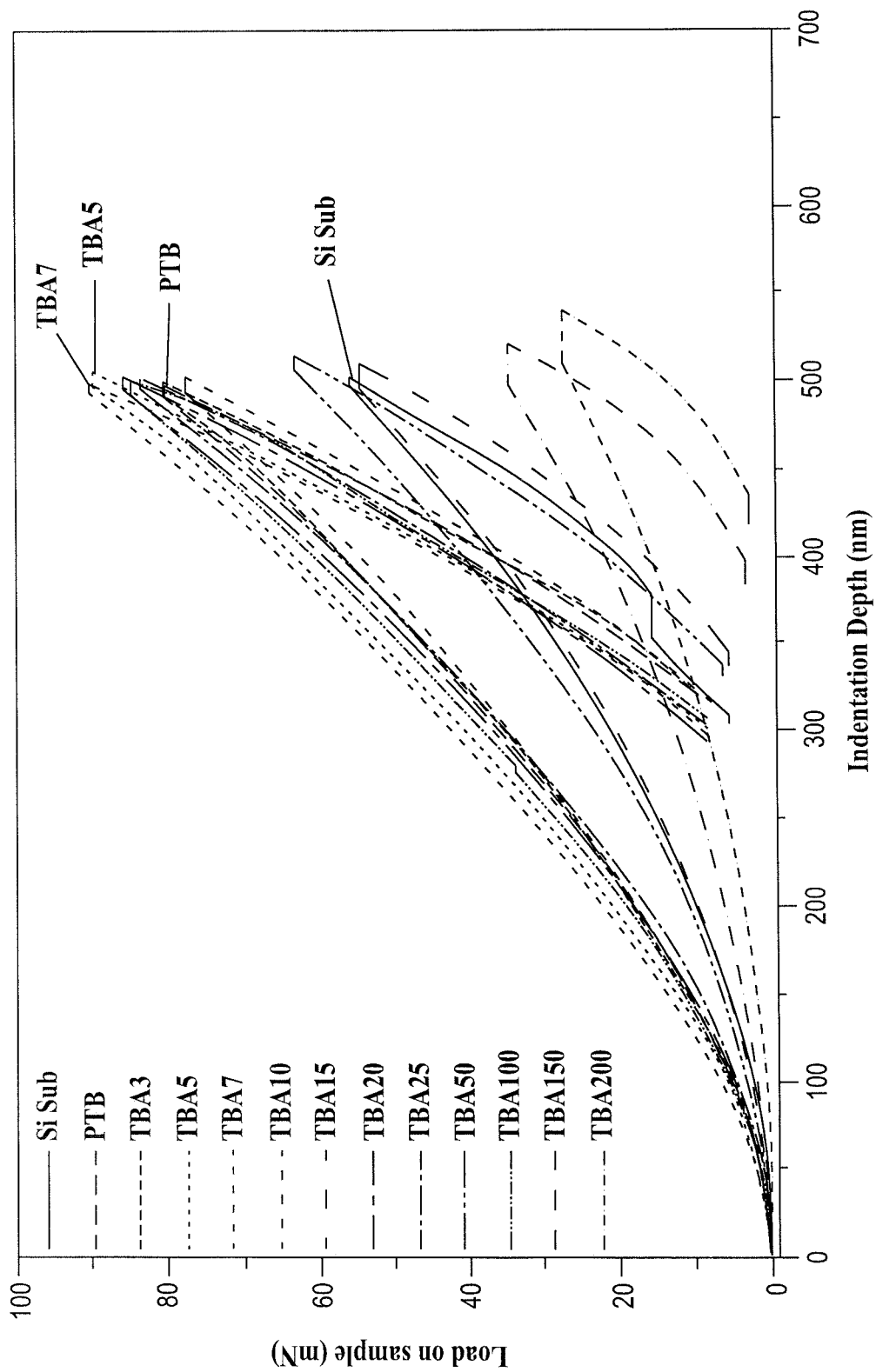
Figure 14:
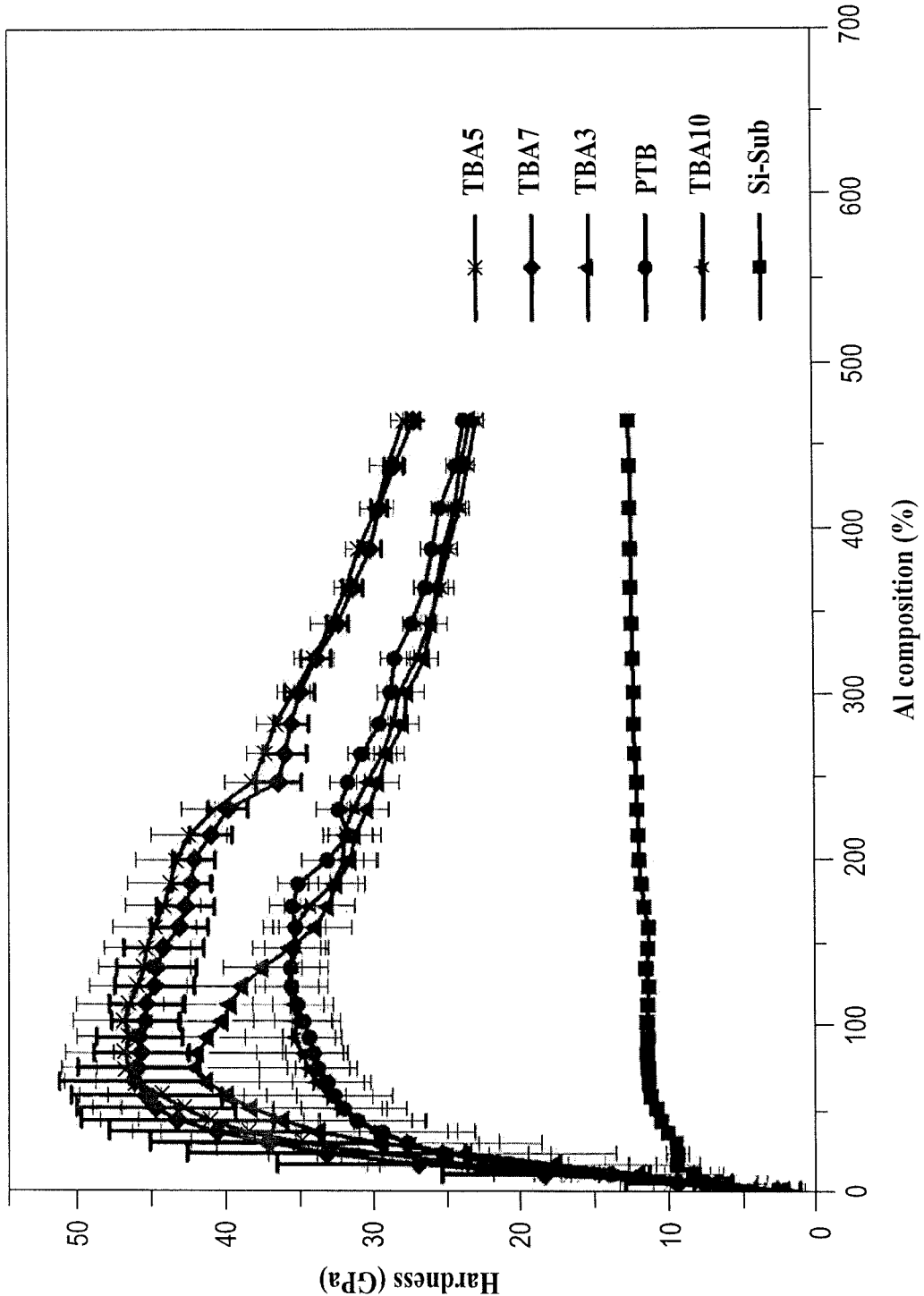
Figure 15:
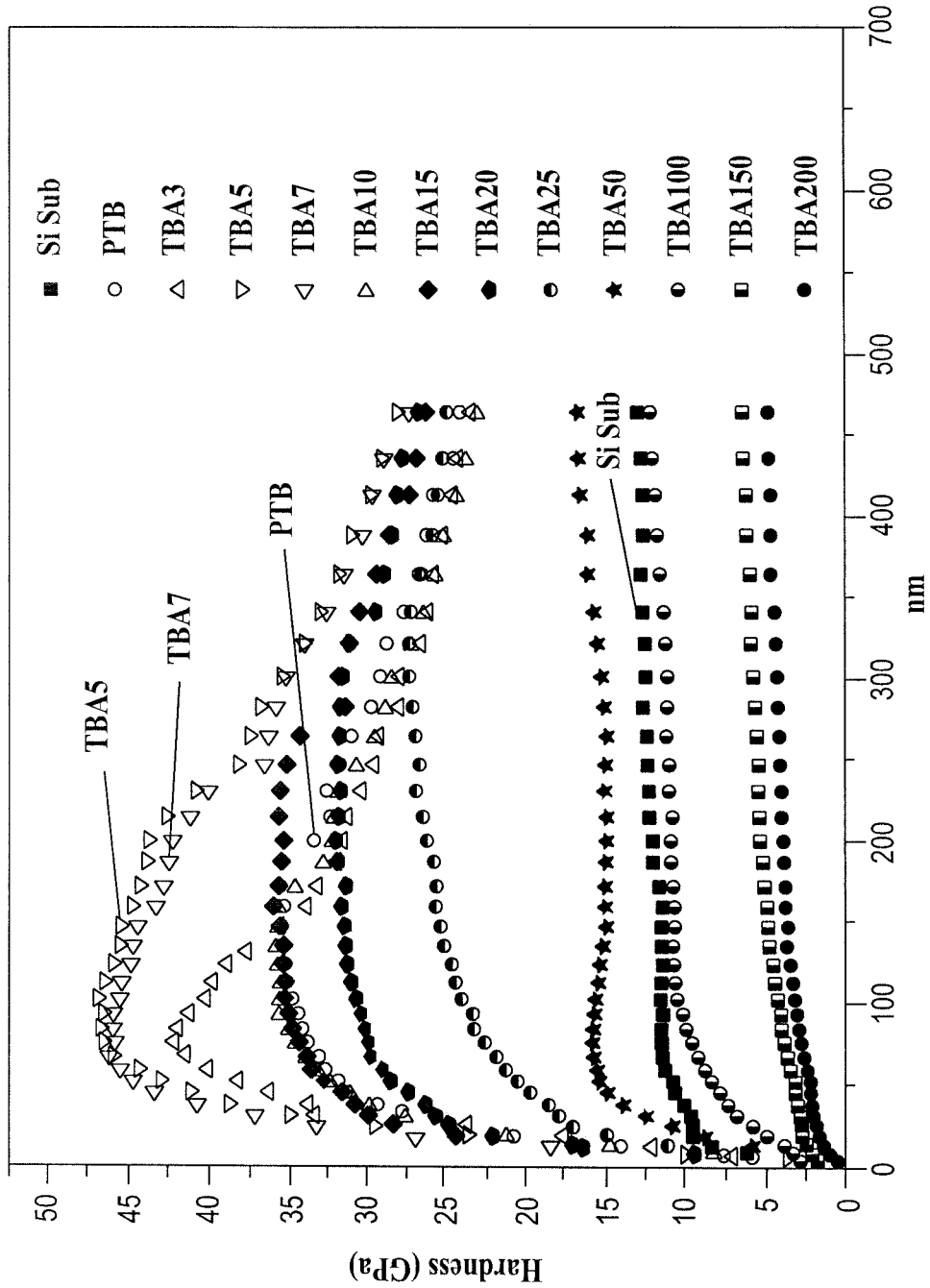
Figure 16:
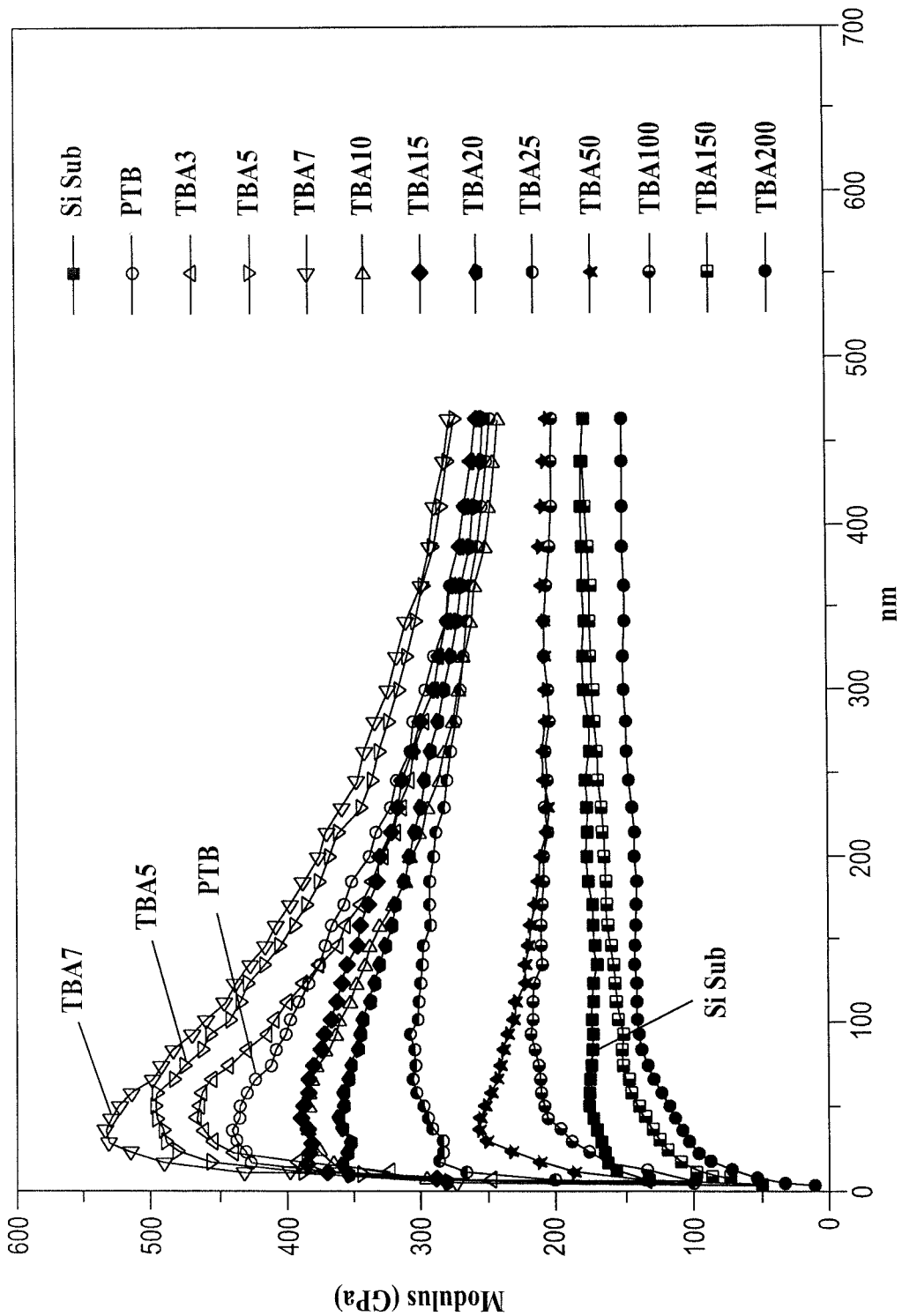
Figure 17:
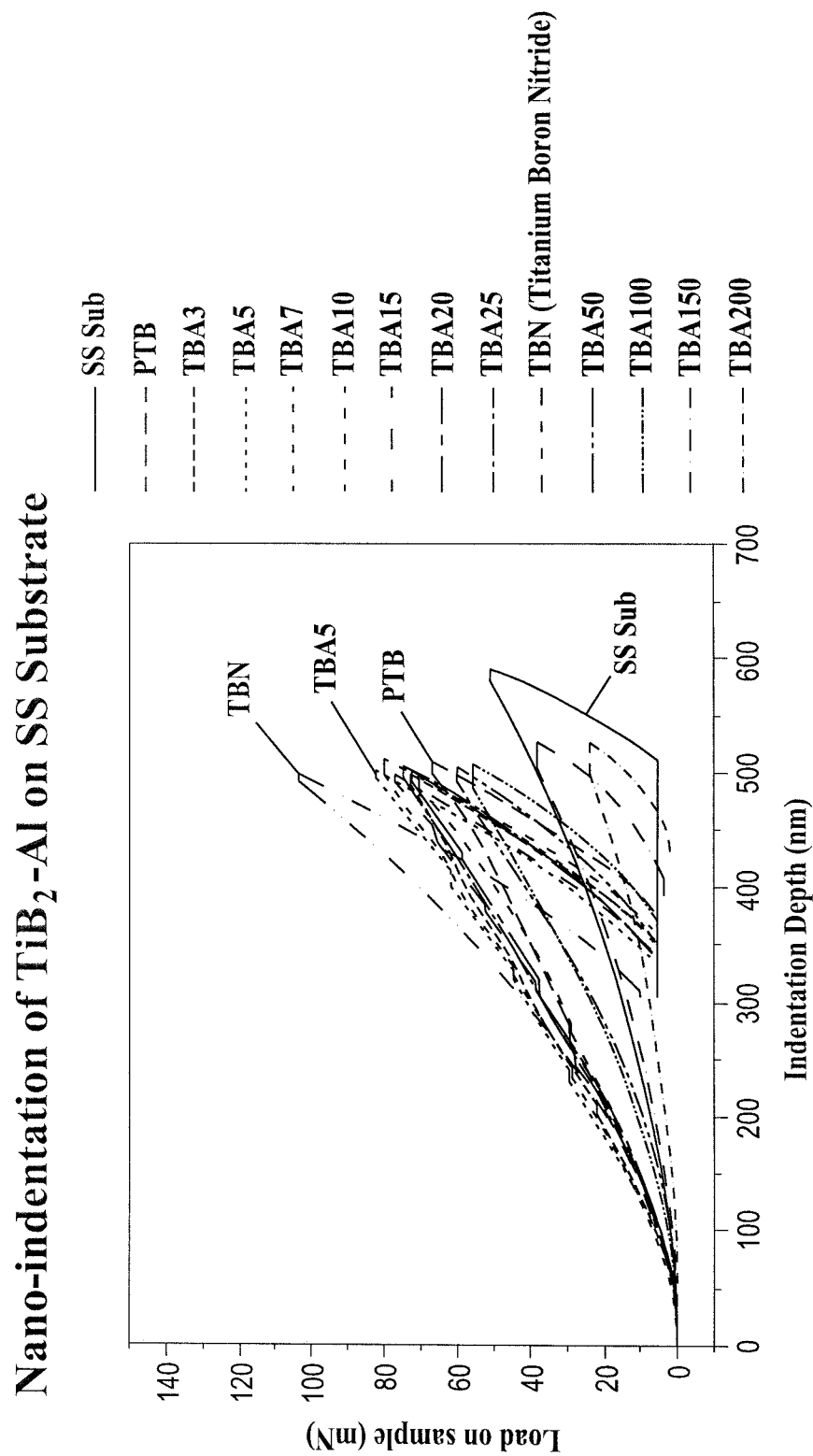
Figure 18:
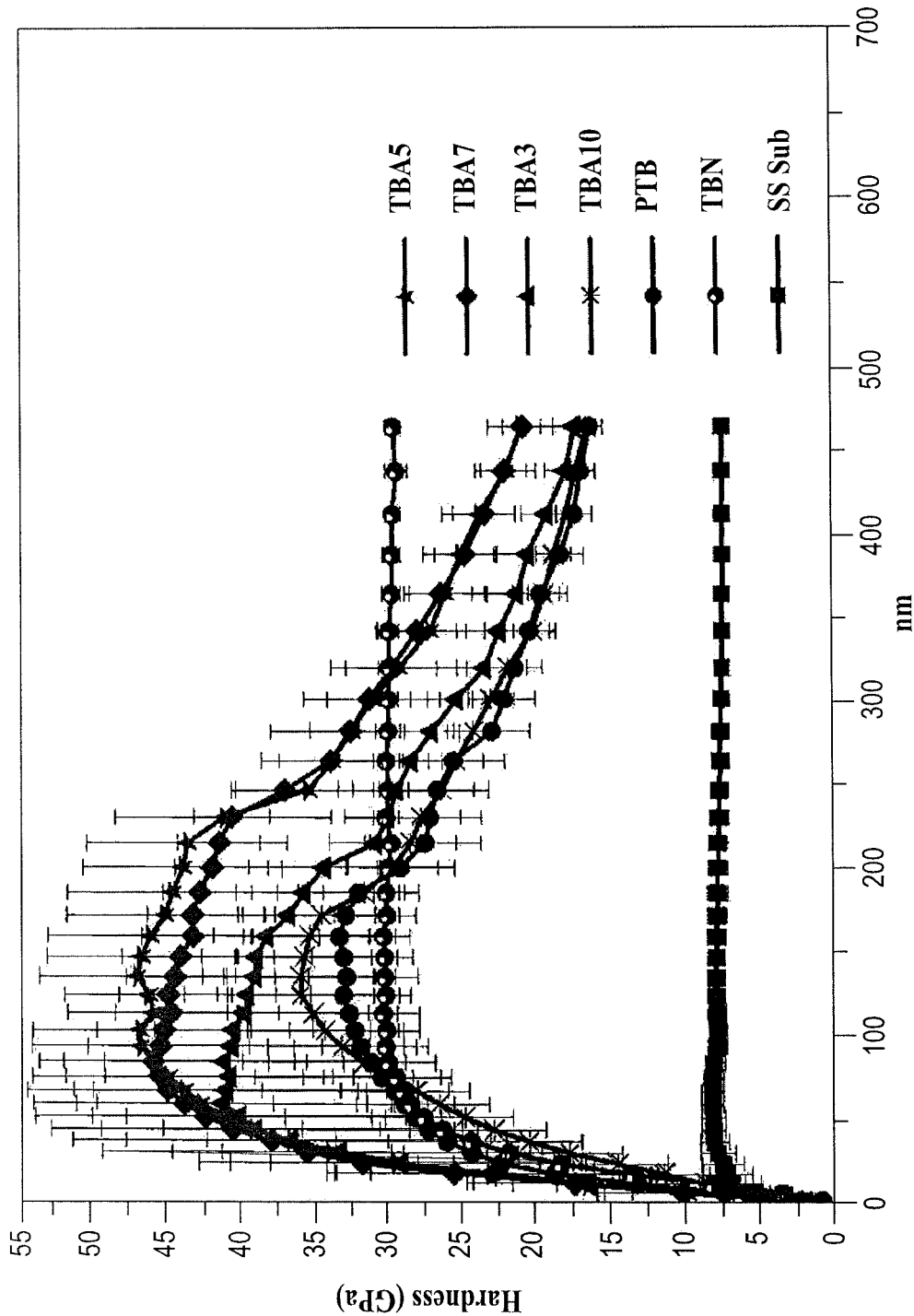
Figure 19:
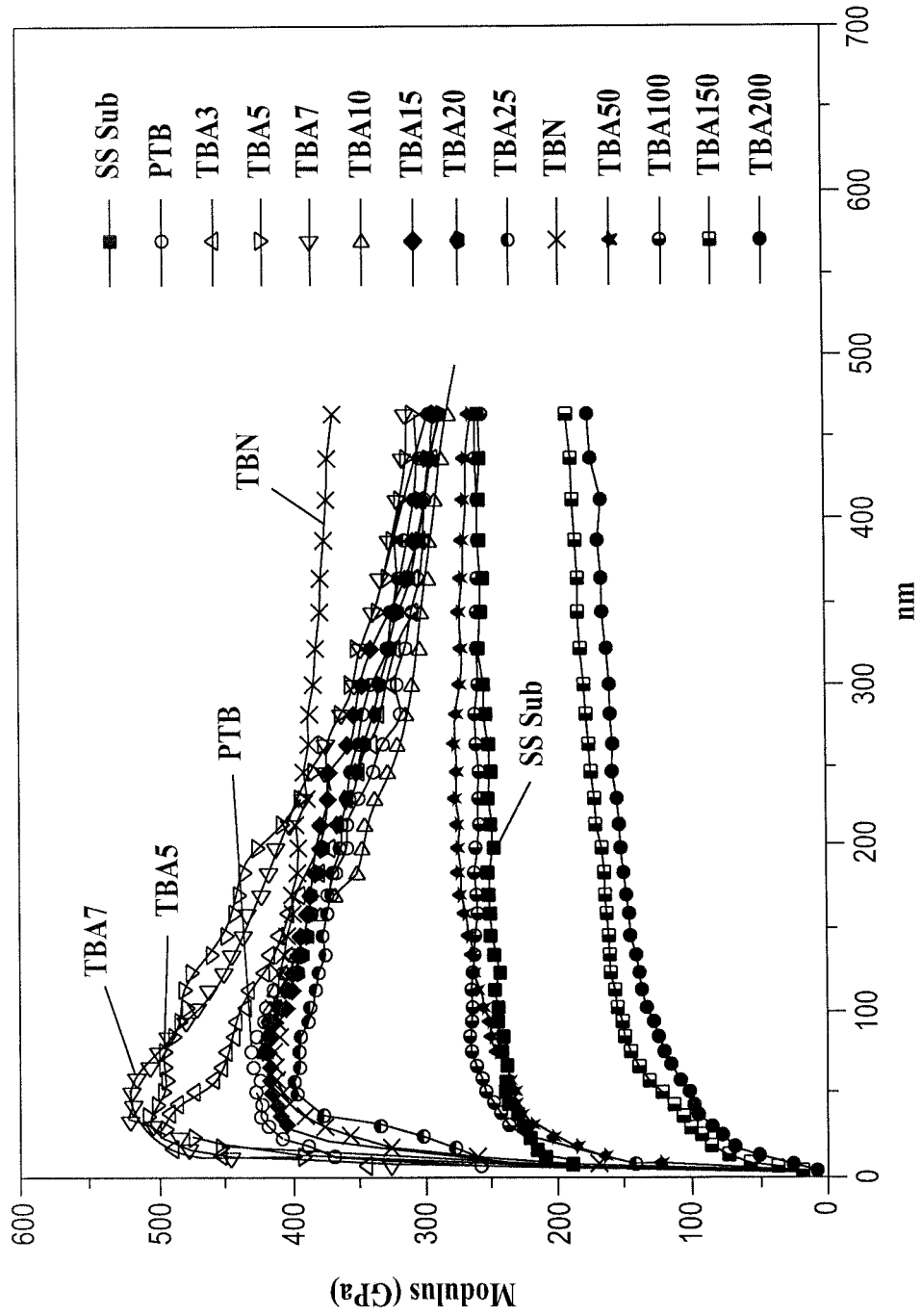
Figure 20:
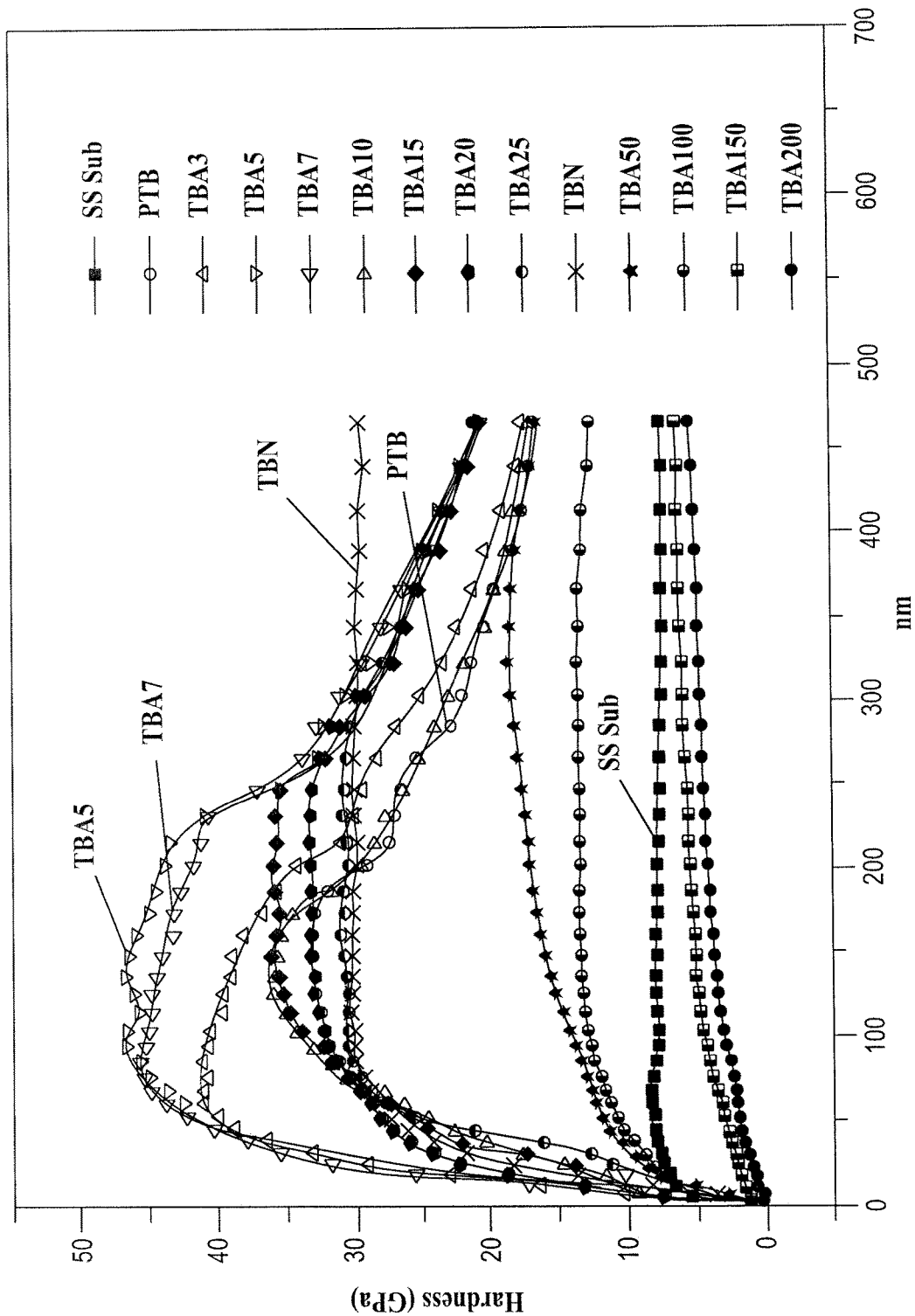
Figure 21:
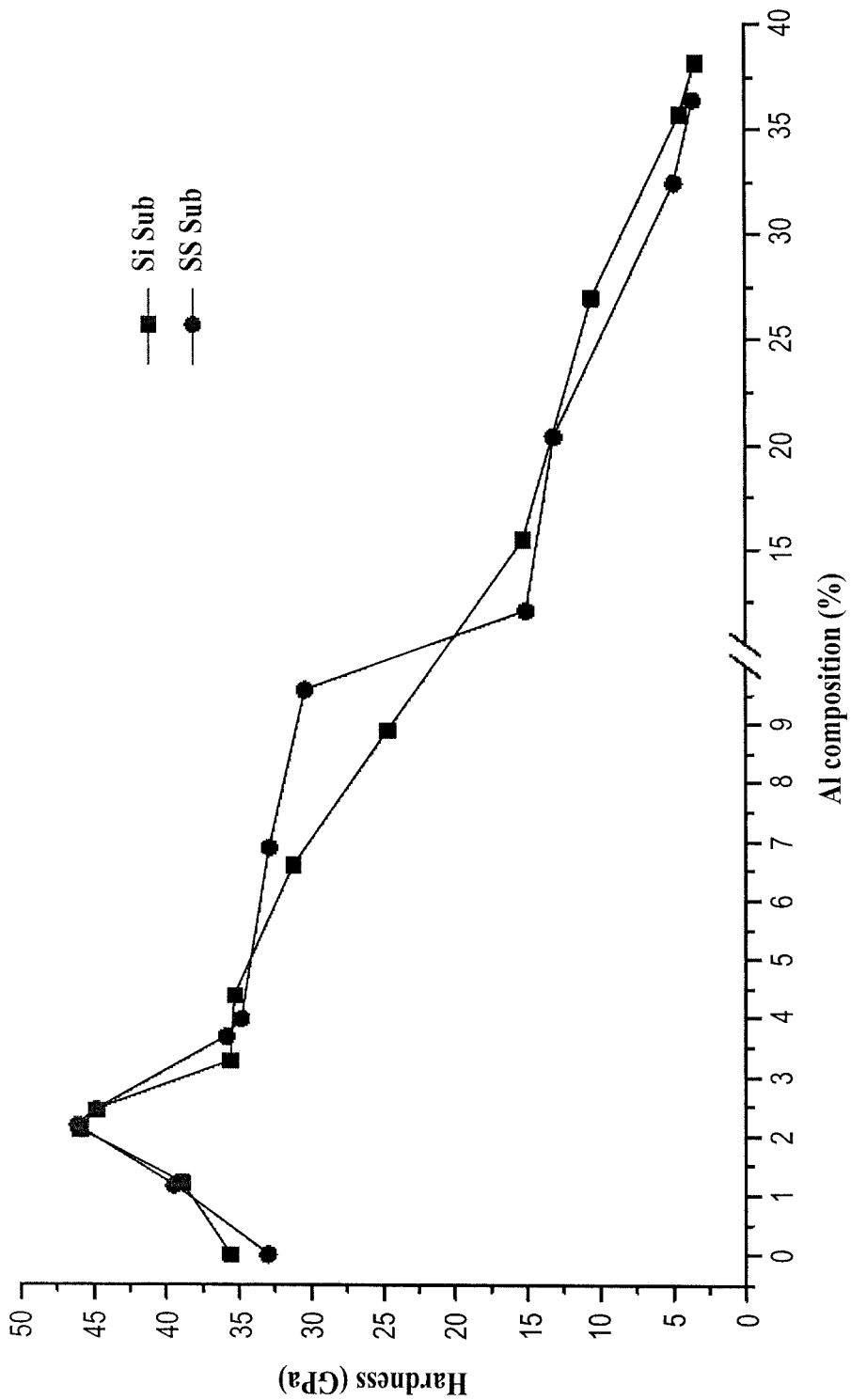
Figure 22:
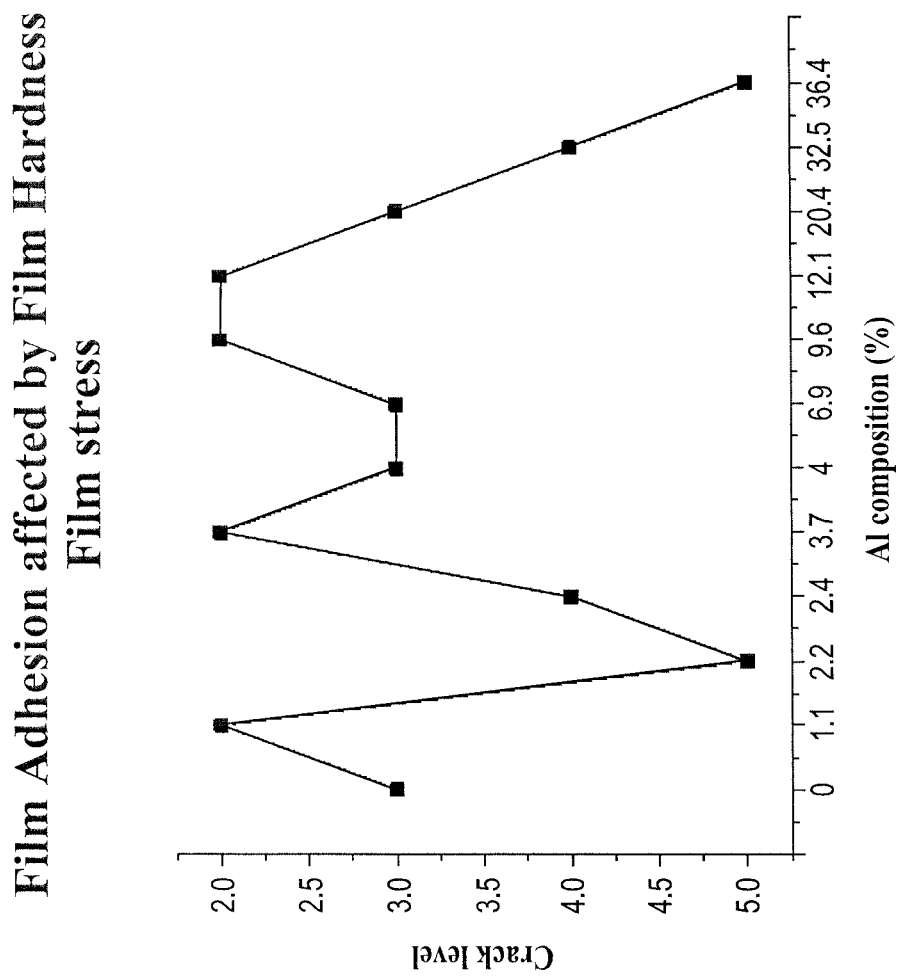
Figure 23:
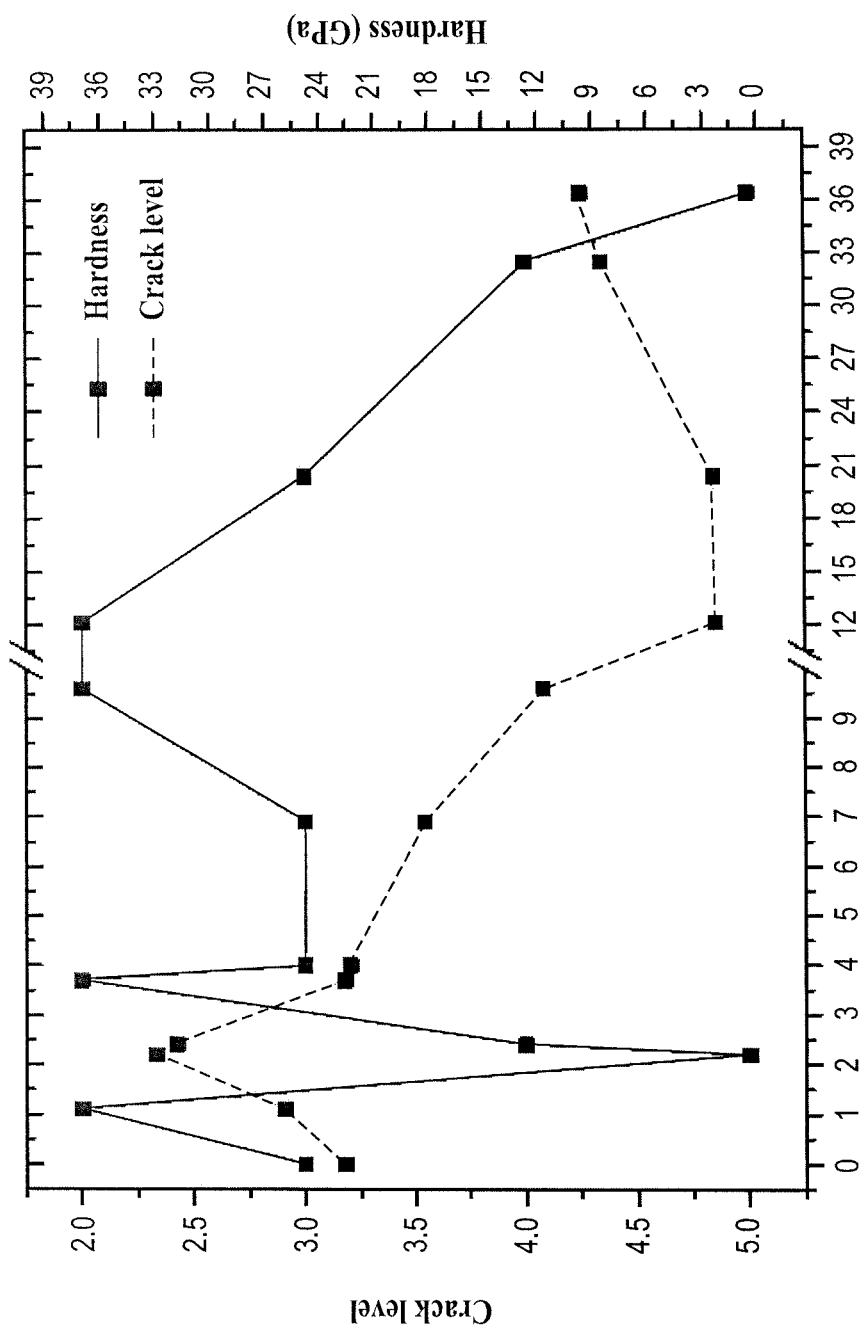
Figure 24:
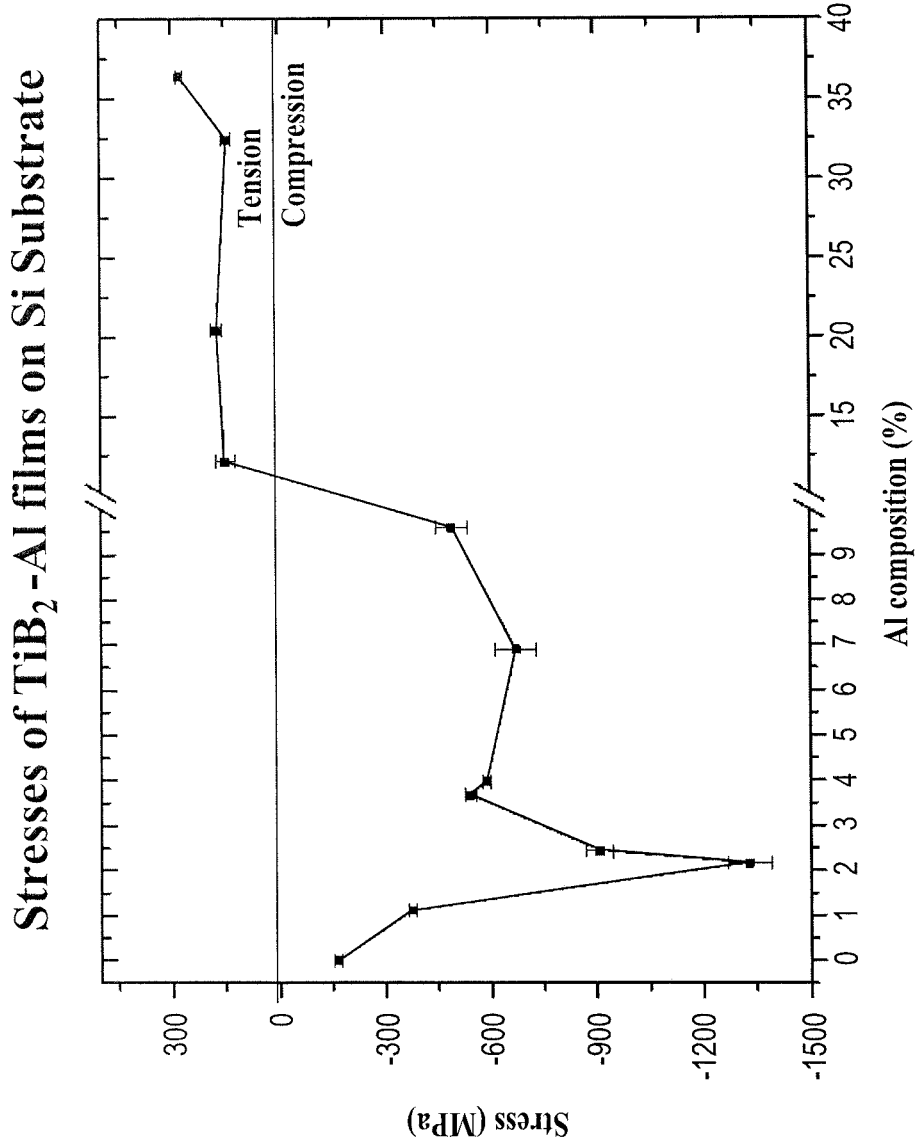
Figure 25:
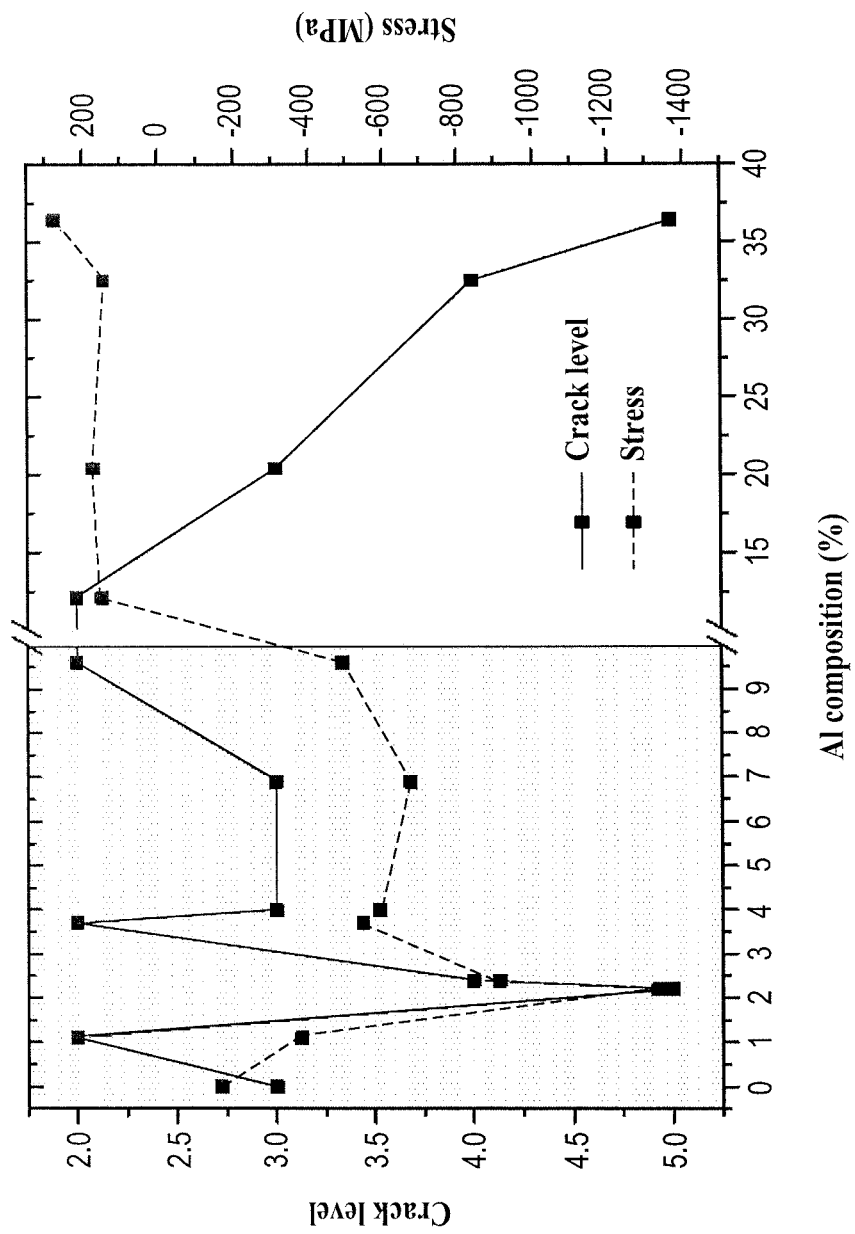

As the results of FIGS. 4 and 5 show, the variation of Target power results in an Al percentage ranging from 1% to 40%. As discussed herein, preferred Al content is 1%-5% by weight, preferably 2%. Complete results gathered from this example are shown in FIGS. 4 to 25.

Example 2

Figure 26:
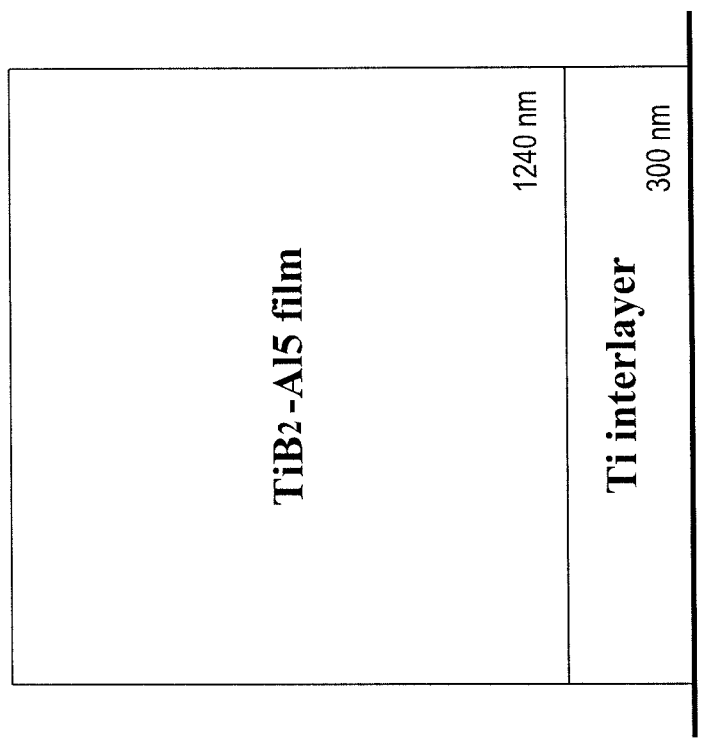
FIG. 26 is a schematic of layered coatings in accordance with Example 2.

A $TiB_2$—Al coating was applied via the magnetron sputtering system in accordance with the following conditions (Table 2) with the gradient layers varied. In particular, a Ti base layer was applied (for example, a base layer having a thickness of 300 nm) and a $TiB_2$—Al coating was applied at a target power of 5 W (to a thickness of 1240 nm) (see FIG. 26). In addition, a $TiB_2$—Al coating was applied to the Ti base layer with varying Al contents (see FIG. 27 where a $TiB_2$—Al coating with layers of various compositions from its lowermost portion to its uppermost portion). In particular, different Al contents were applied using applied target powers ranging from 5 W to 100 W (referenced as TBA5-TBA100, respectively, which stands for $TiB_2$—Al applied with target power of #W (which designation is used throughout the figures) to produce layered coatings of different Al contents which were then tested as shown below.

TABLE 2

| Substrate (Sub.) | Silicon (Si)(100), Stainless Steel (SS) |
|---|---|
| Target | $TiB_2 \times 2$, Al $\times$ 1 |
| Target power (DC) | $TiB_2$: 200 W $\times$ 2 |
| | Al: 5 W (resulting in a $TiB_2$—Al coating with 2% Al) |
| | $TiB_2$: 200 W $\times$ 2 |
| | Al: 5 W-100 W |
| Substrate Bias (RF) | −60 V dc |
| Working Pressure | (8 $\times$ 10$^{-3}$ torr) |
| Reactive gas | Ar (40 sccm) |
| Deposition time | 2 hrs |
| Substrate temperature | 200° C. |

Figure 28:
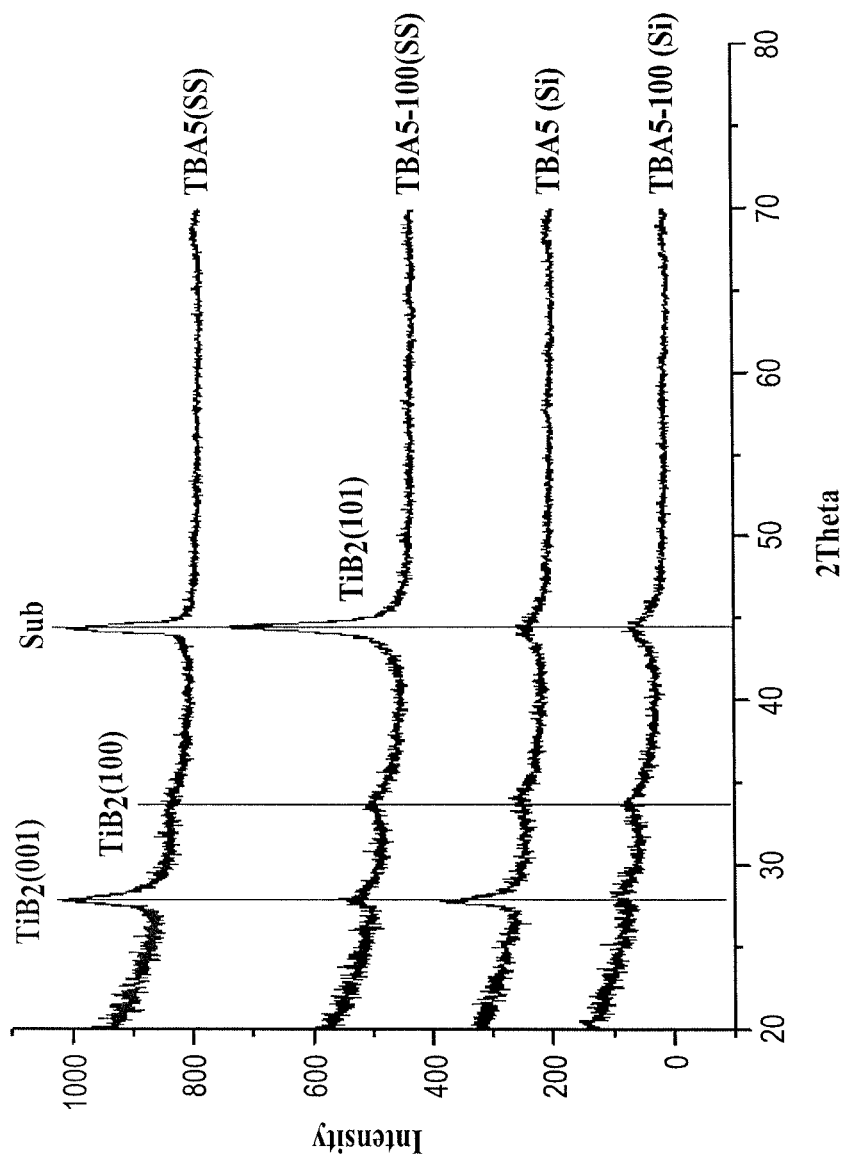
FIGS. 28 to 31 represent test results generated in accordance with Example 2 as discussed below.
Figure 29:
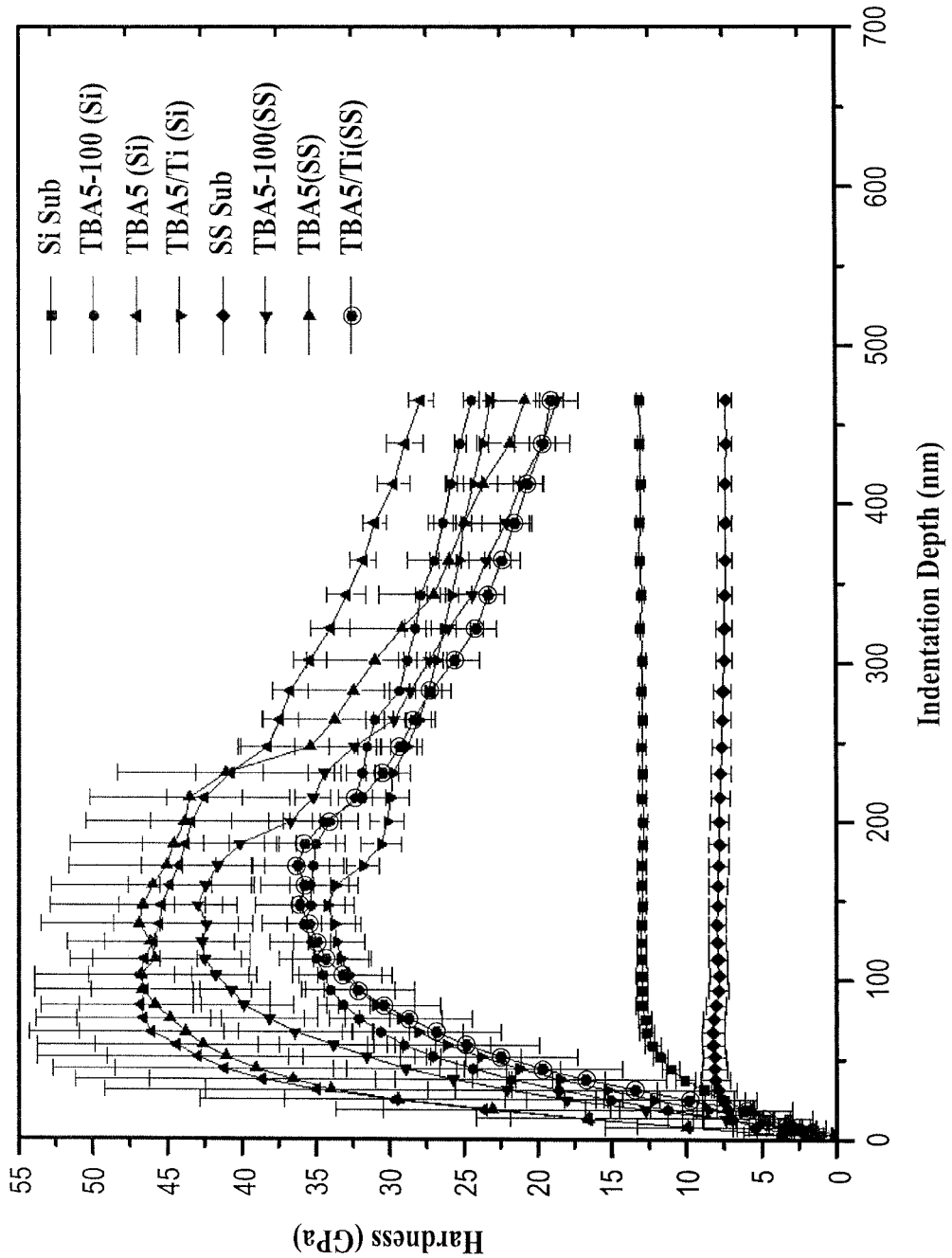
Figure 30:
Figure 30:
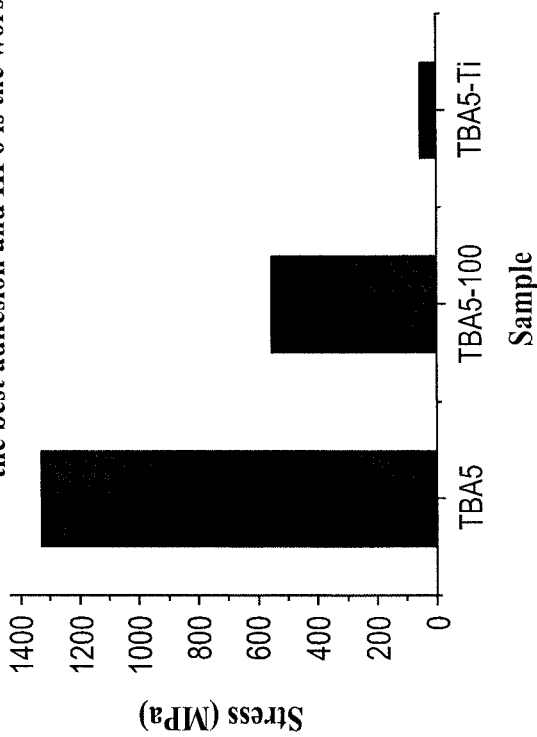
Figure 31:
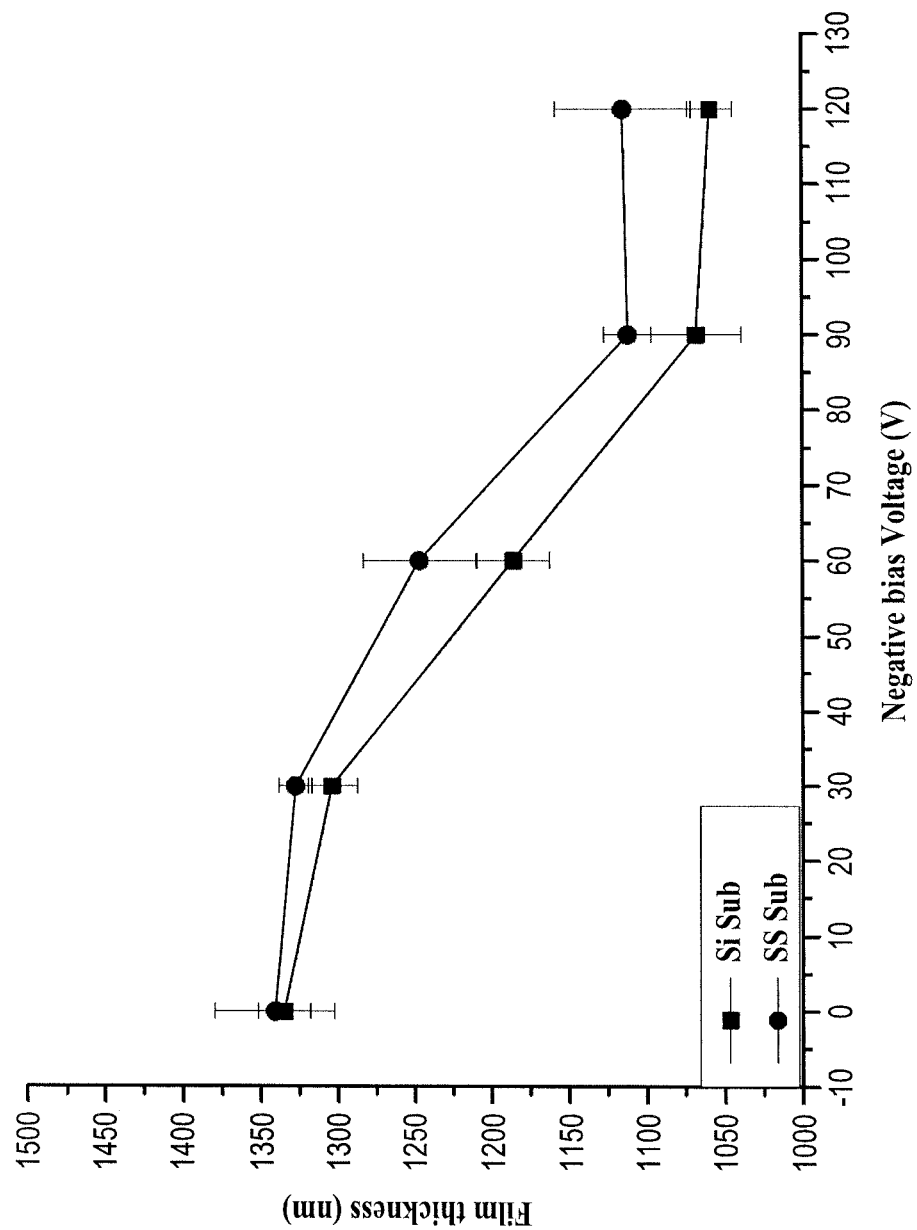
Figure 32:
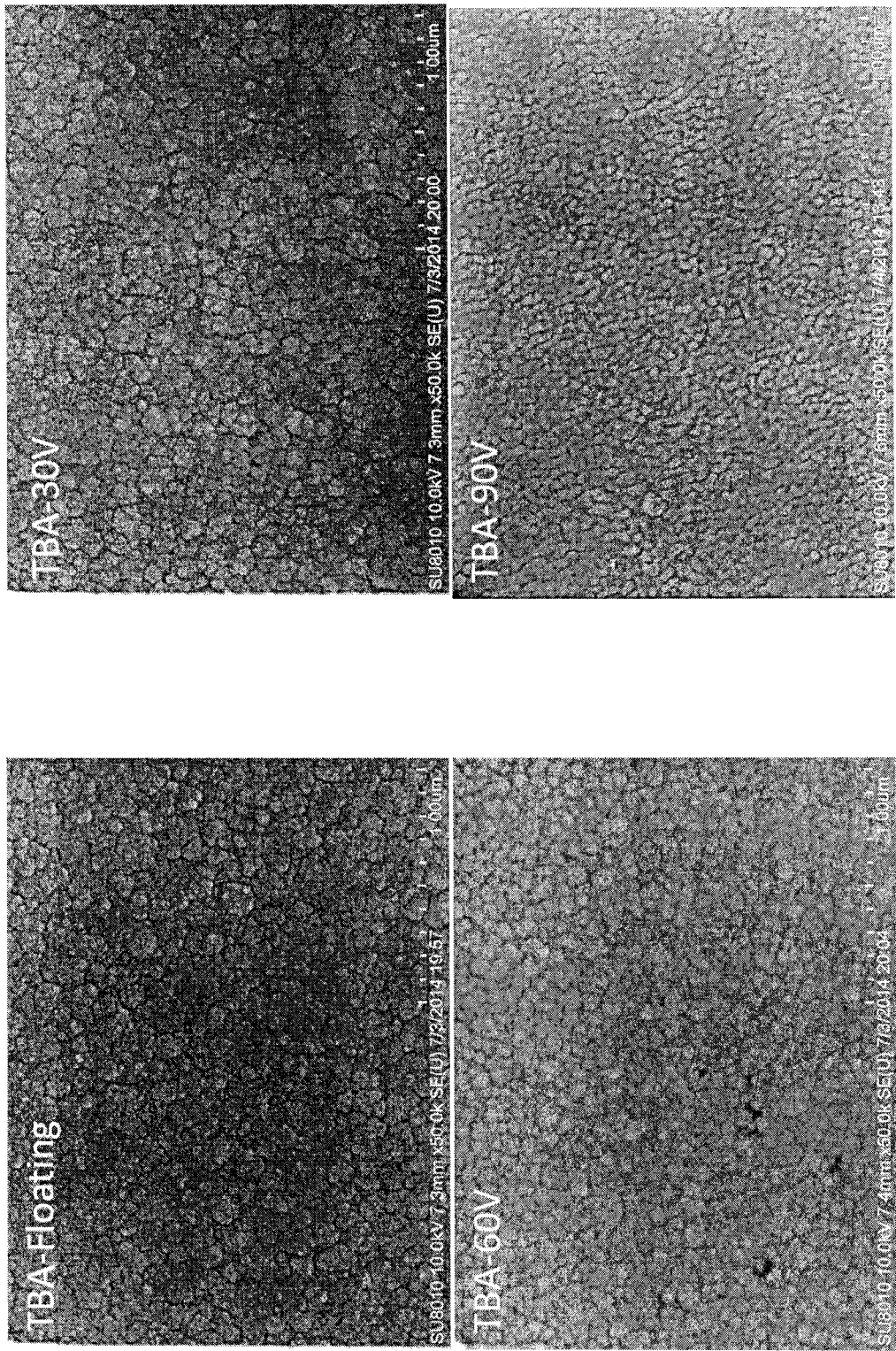
FIGS. 32 to 40 represent test results generated in accordance with Example 3 as discussed below.
Figure 33:
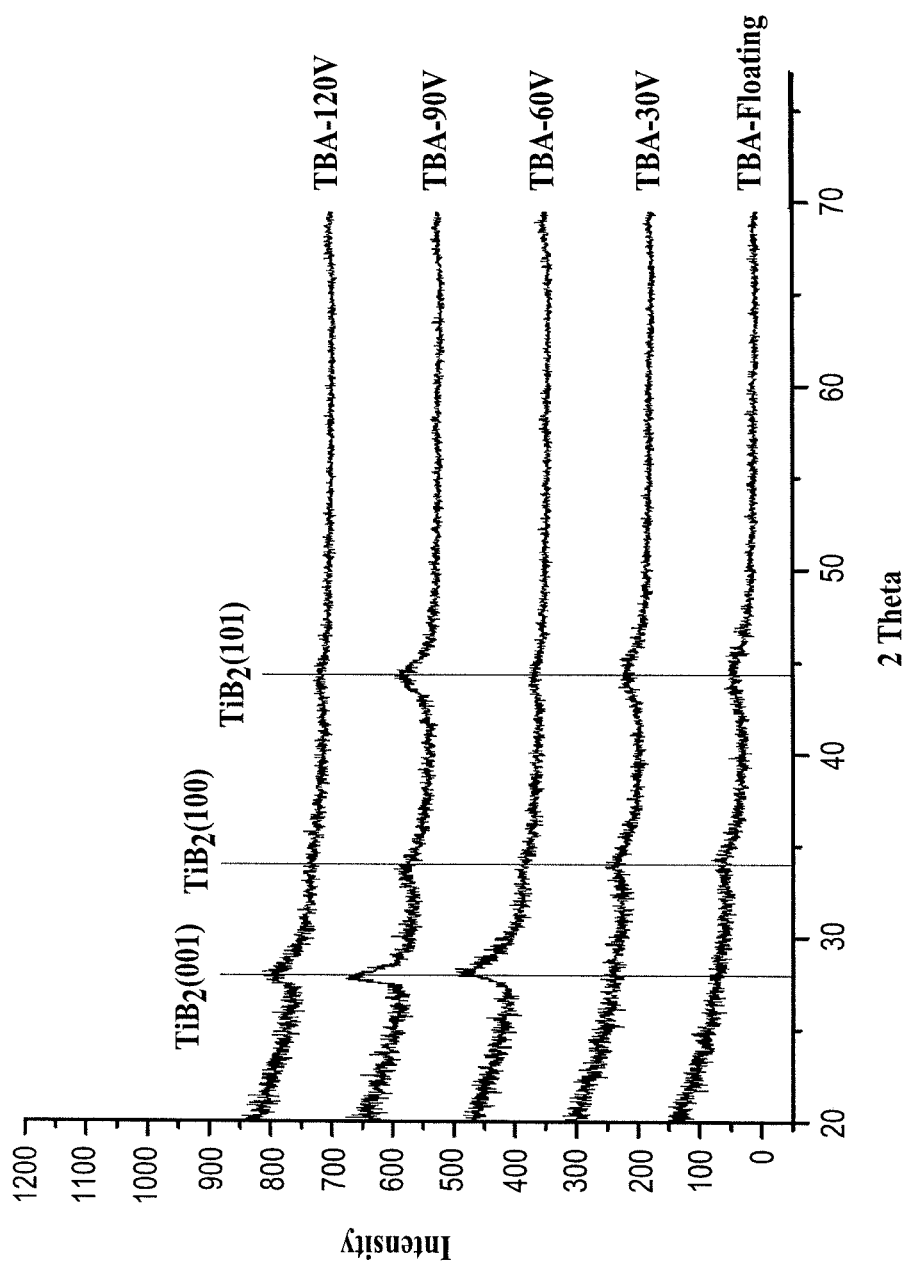
Figure 34:
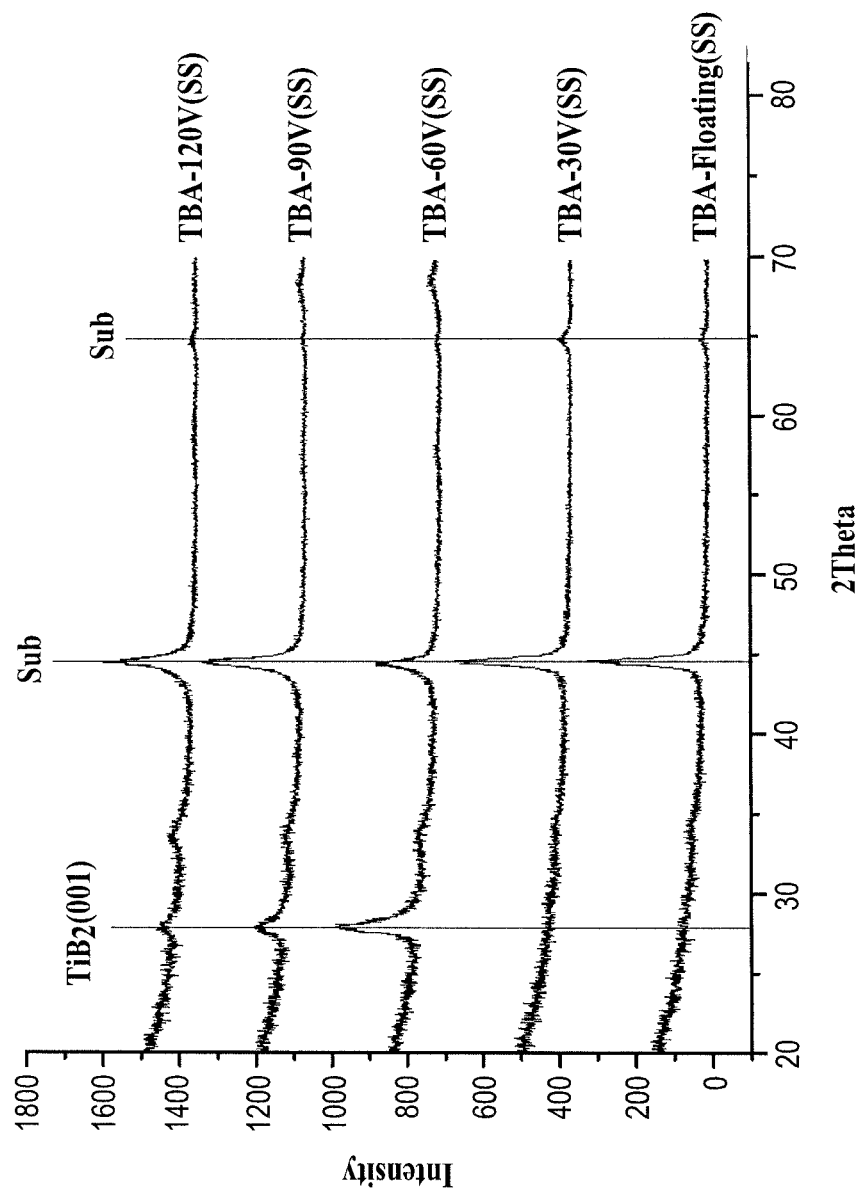
Figure 35:
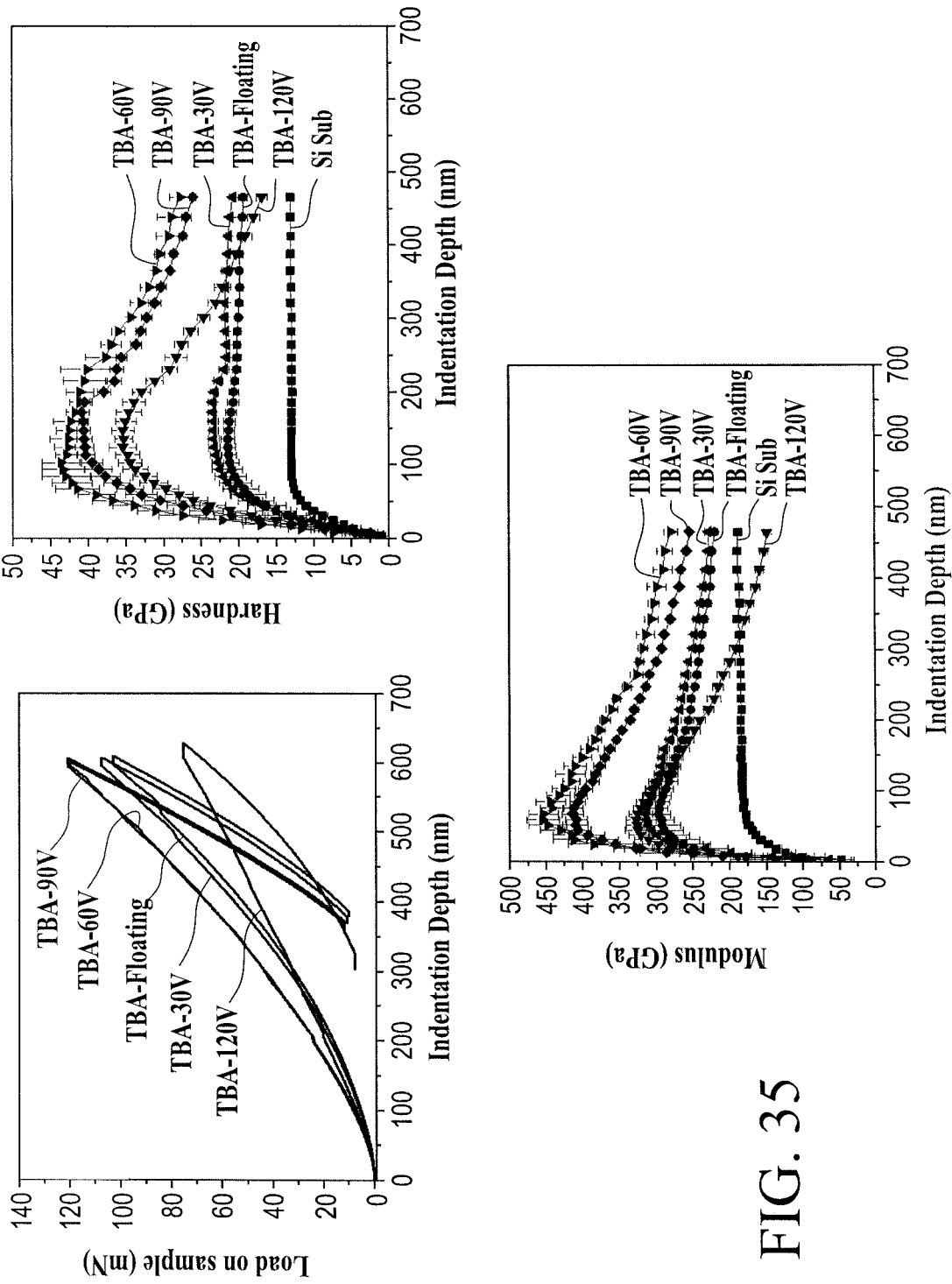
Figure 36:
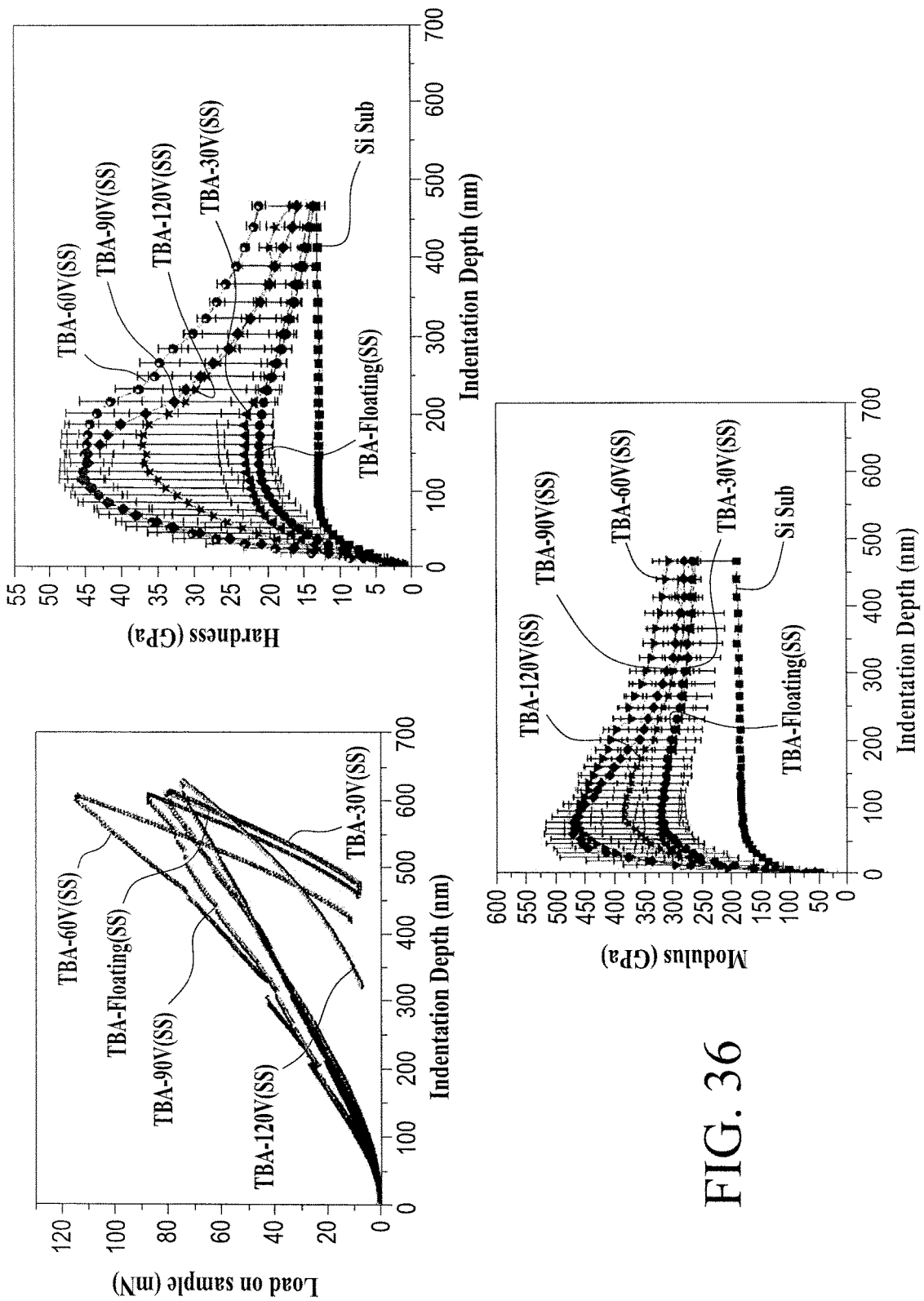
Figure 37:
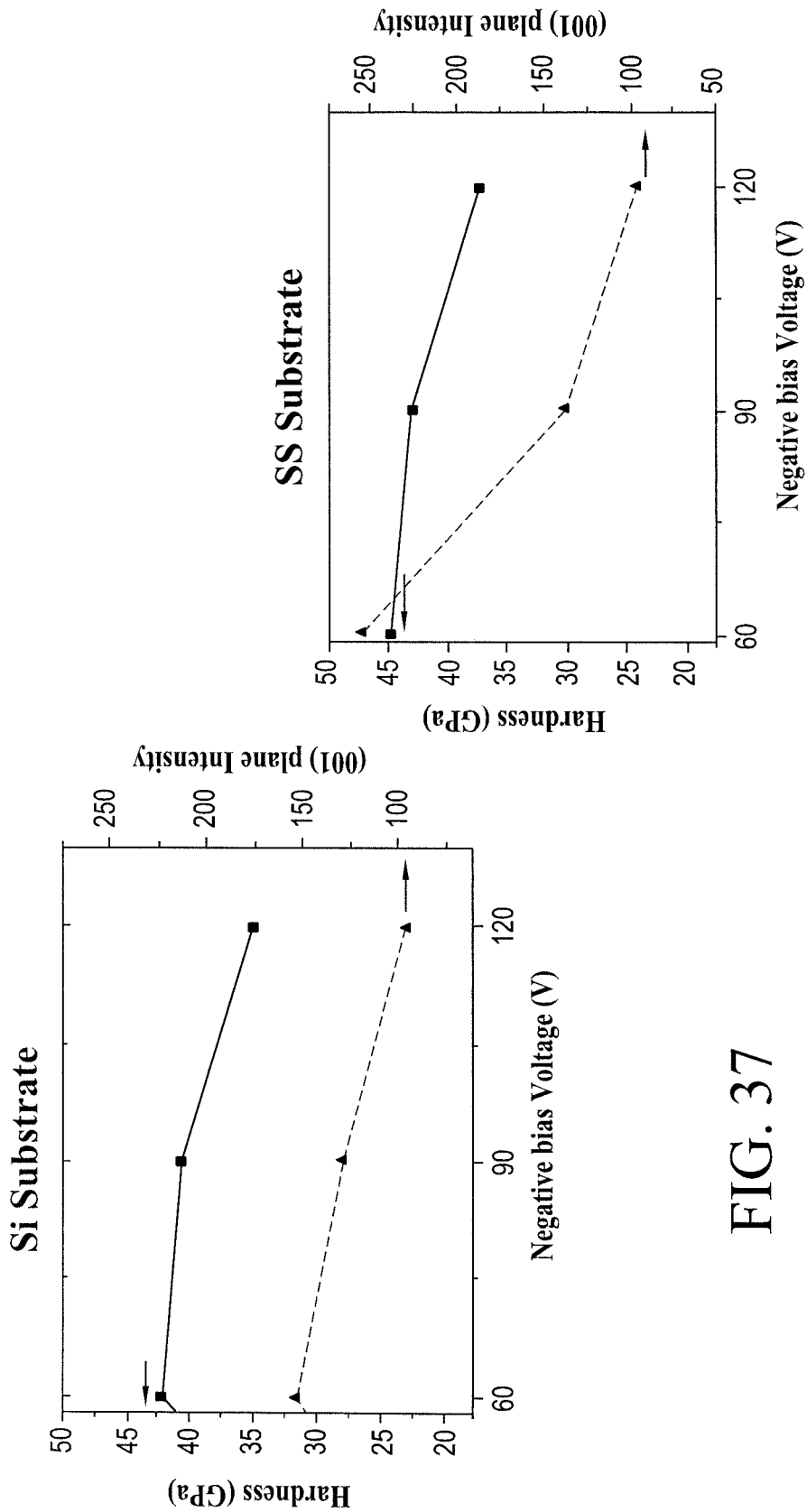
Figure 38:
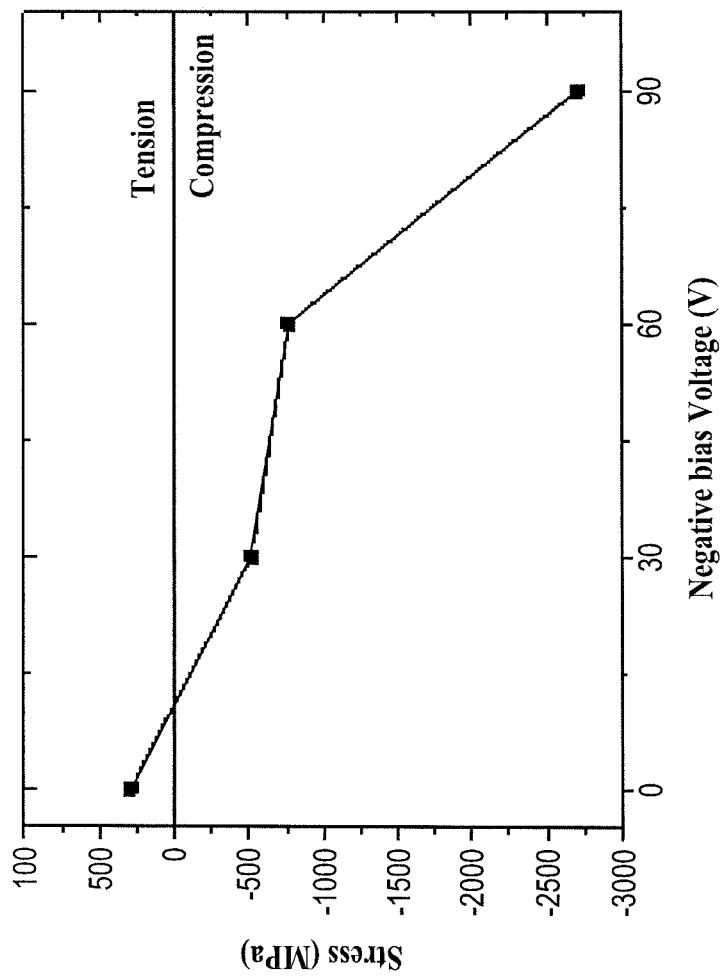
Figure 39:
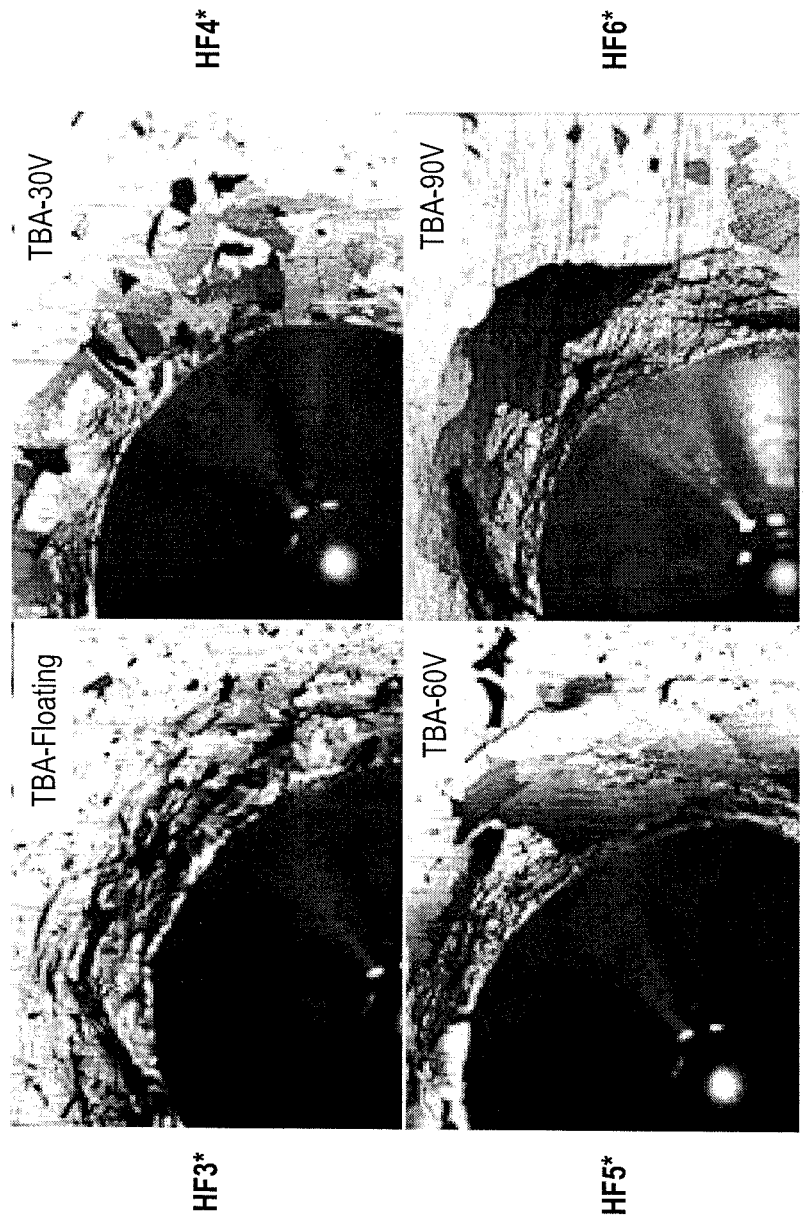
Figure 40:
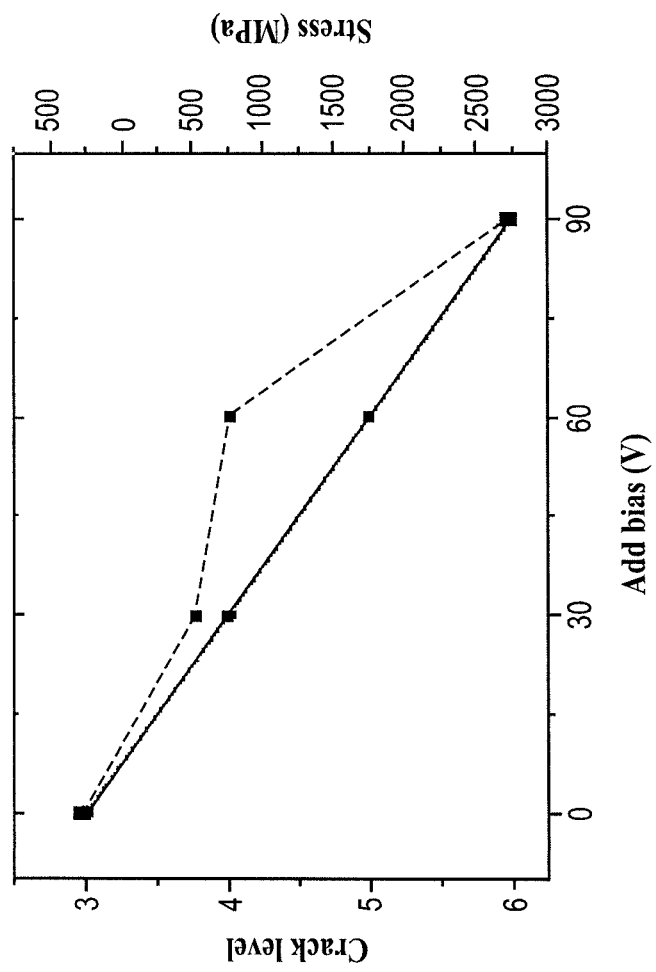
Figure 41:
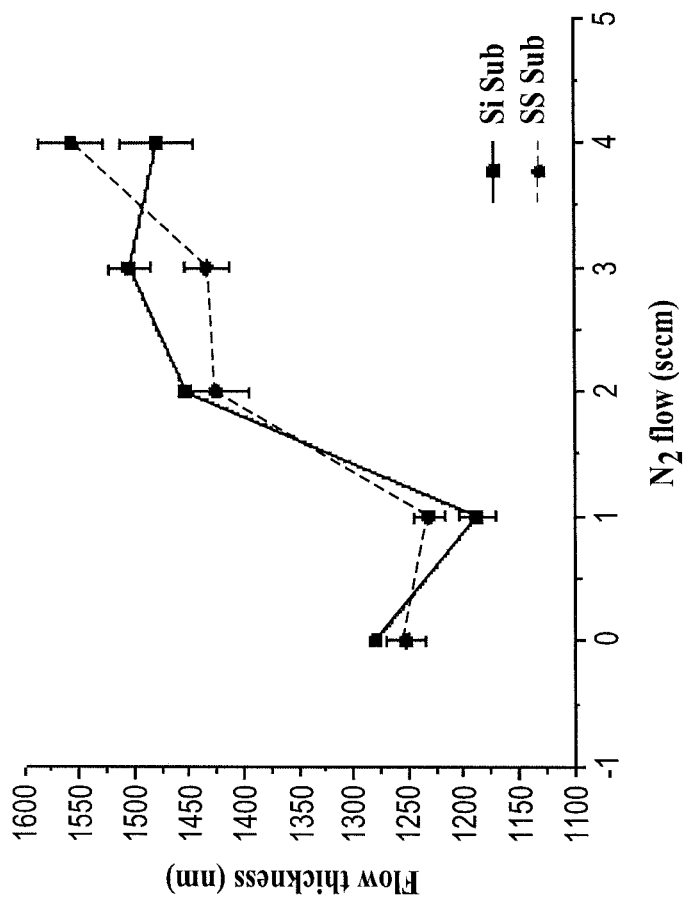
FIGS. 41 to 47 represent test results generated in accordance with Example 4 as discussed below.
Figure 42:
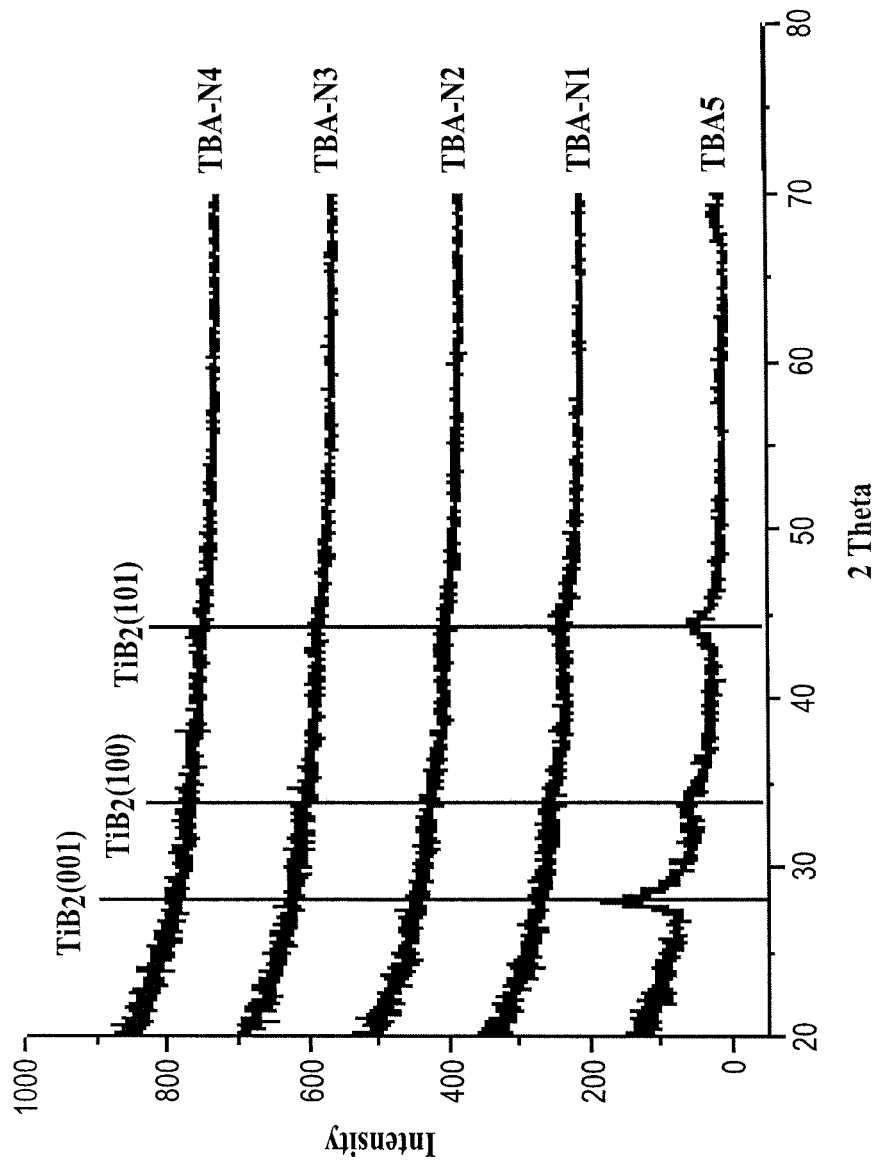
Figure 43:
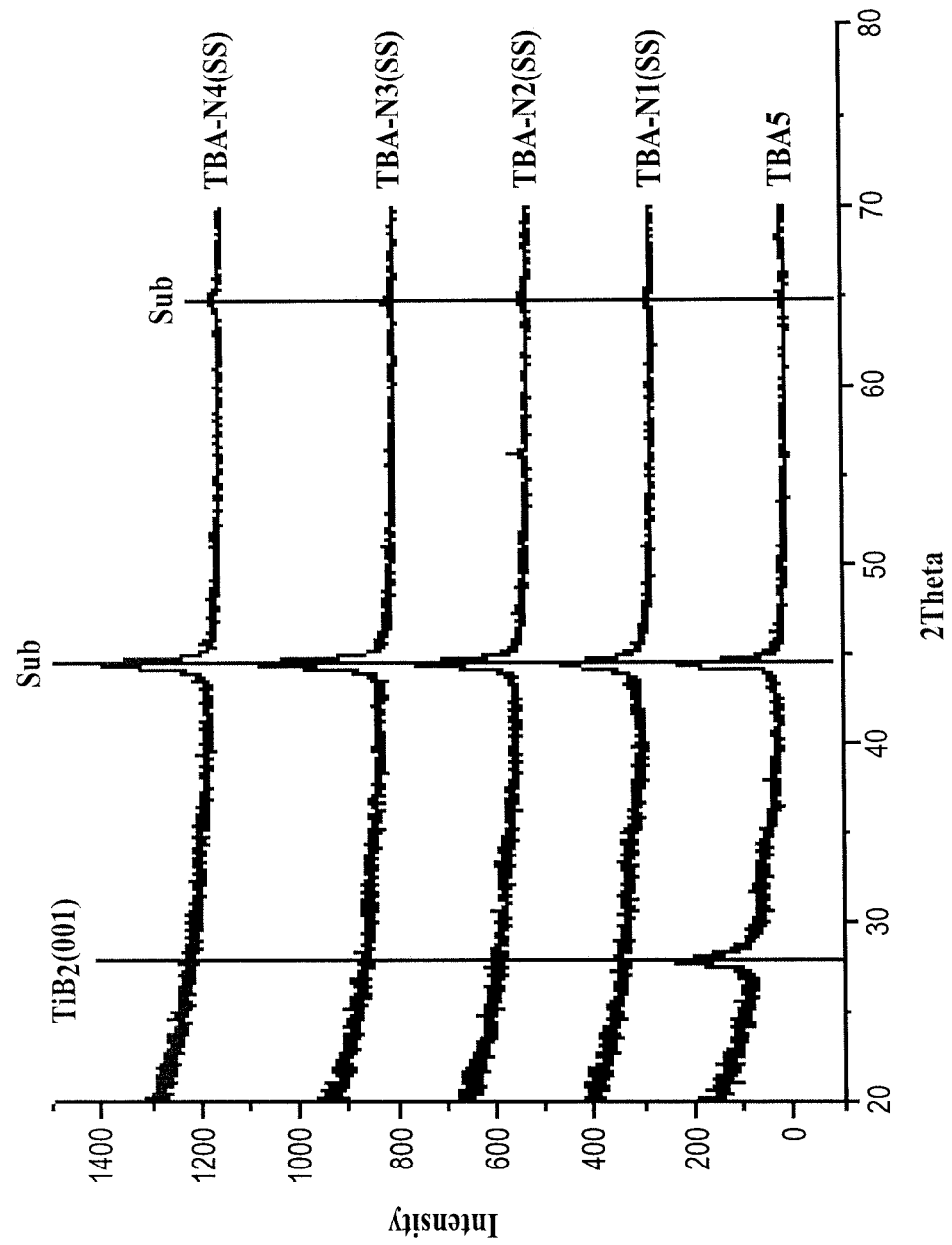
Figure 44:
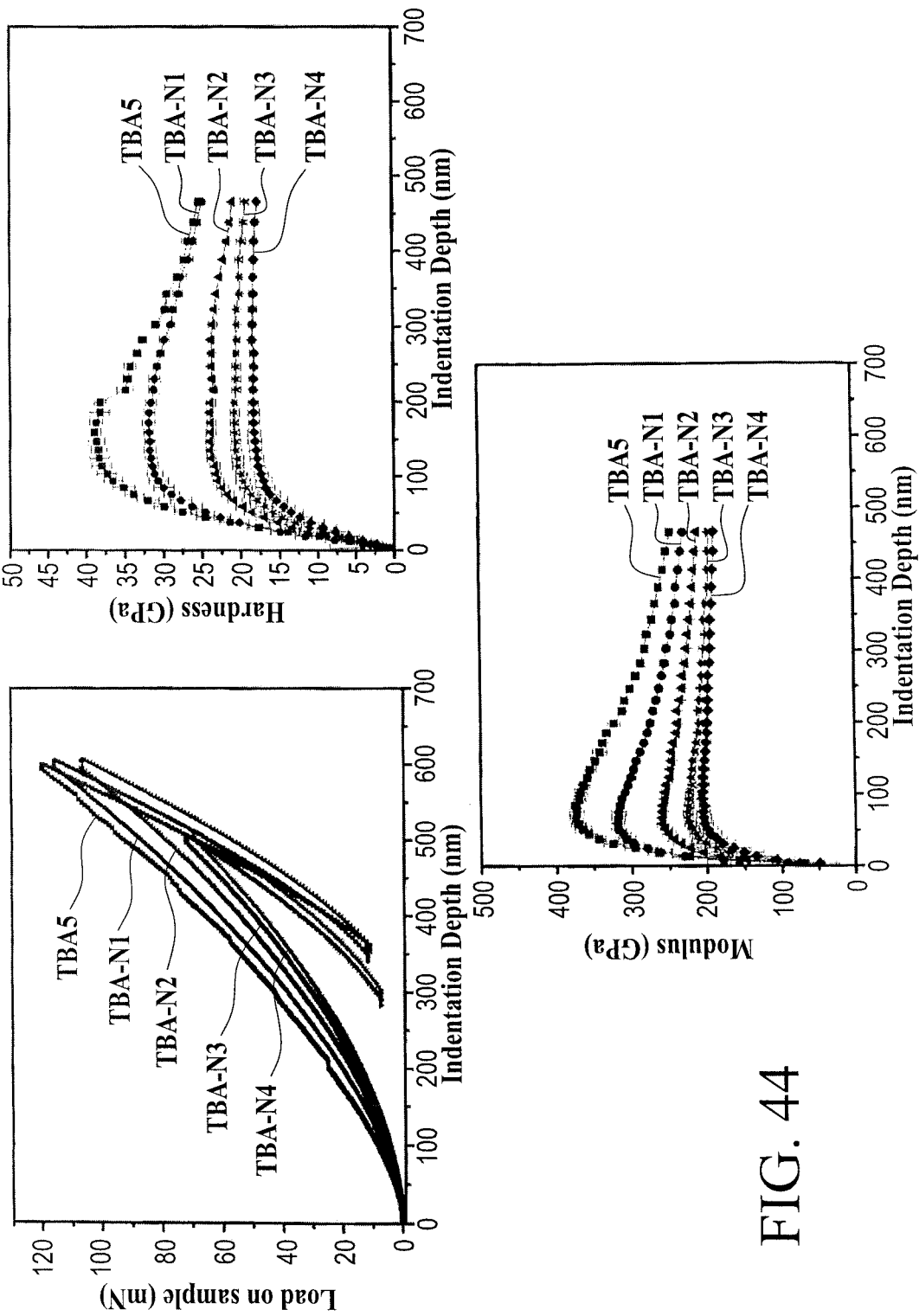
Figure 45:
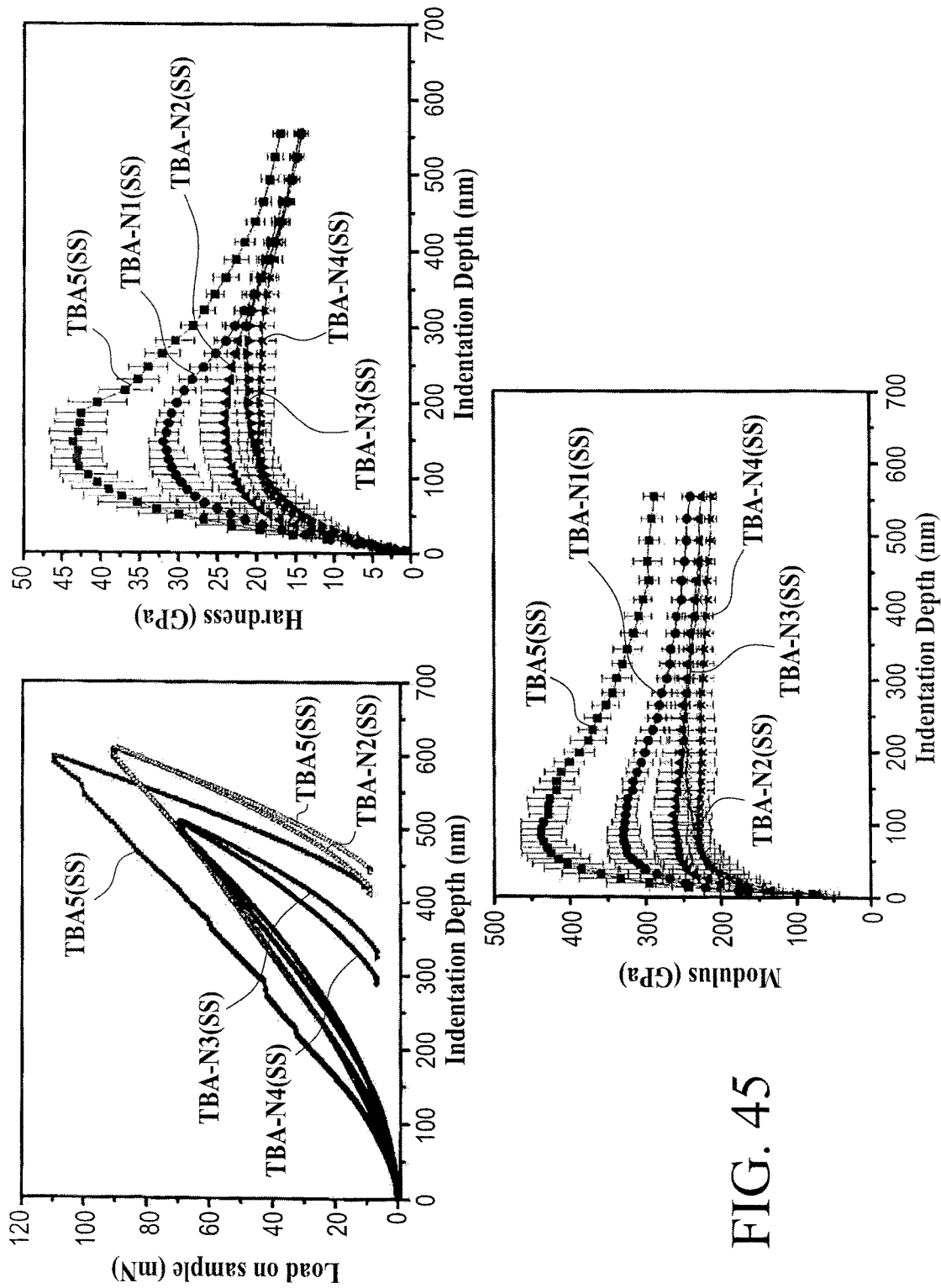
Figure 46:
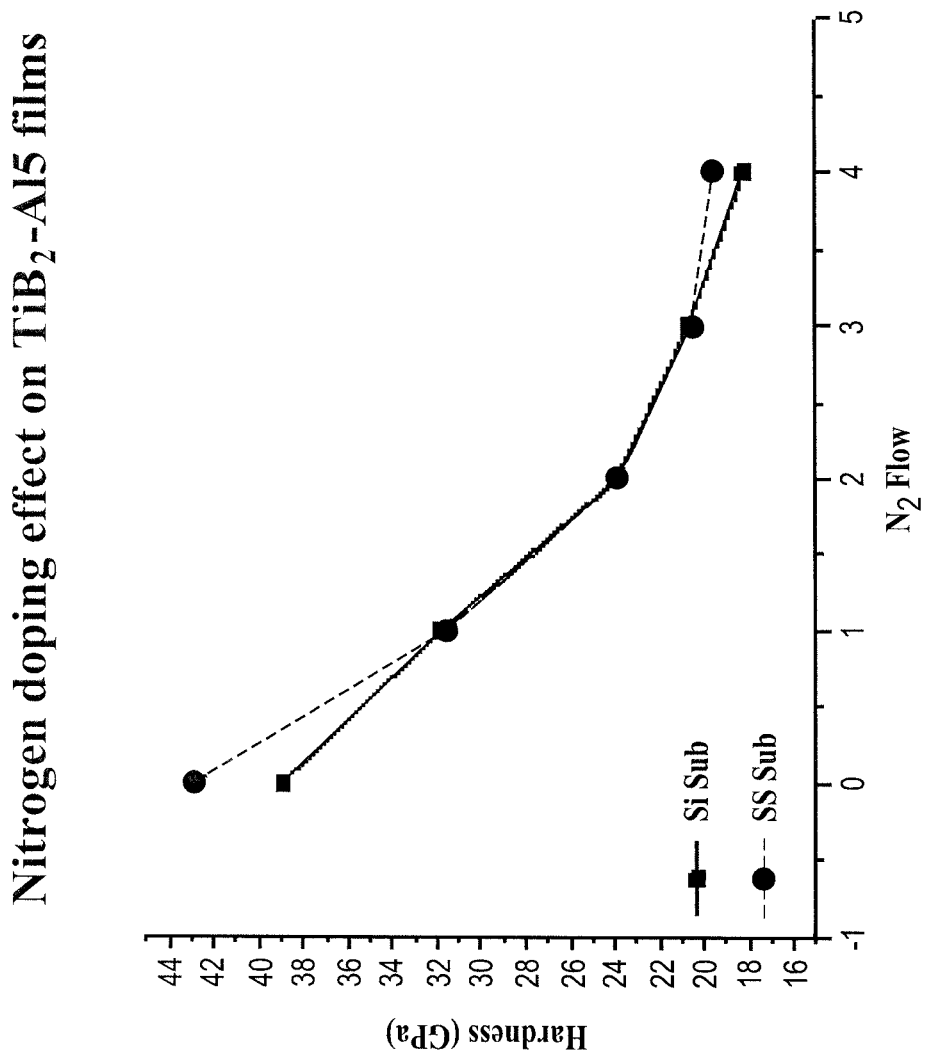
Figure 47:
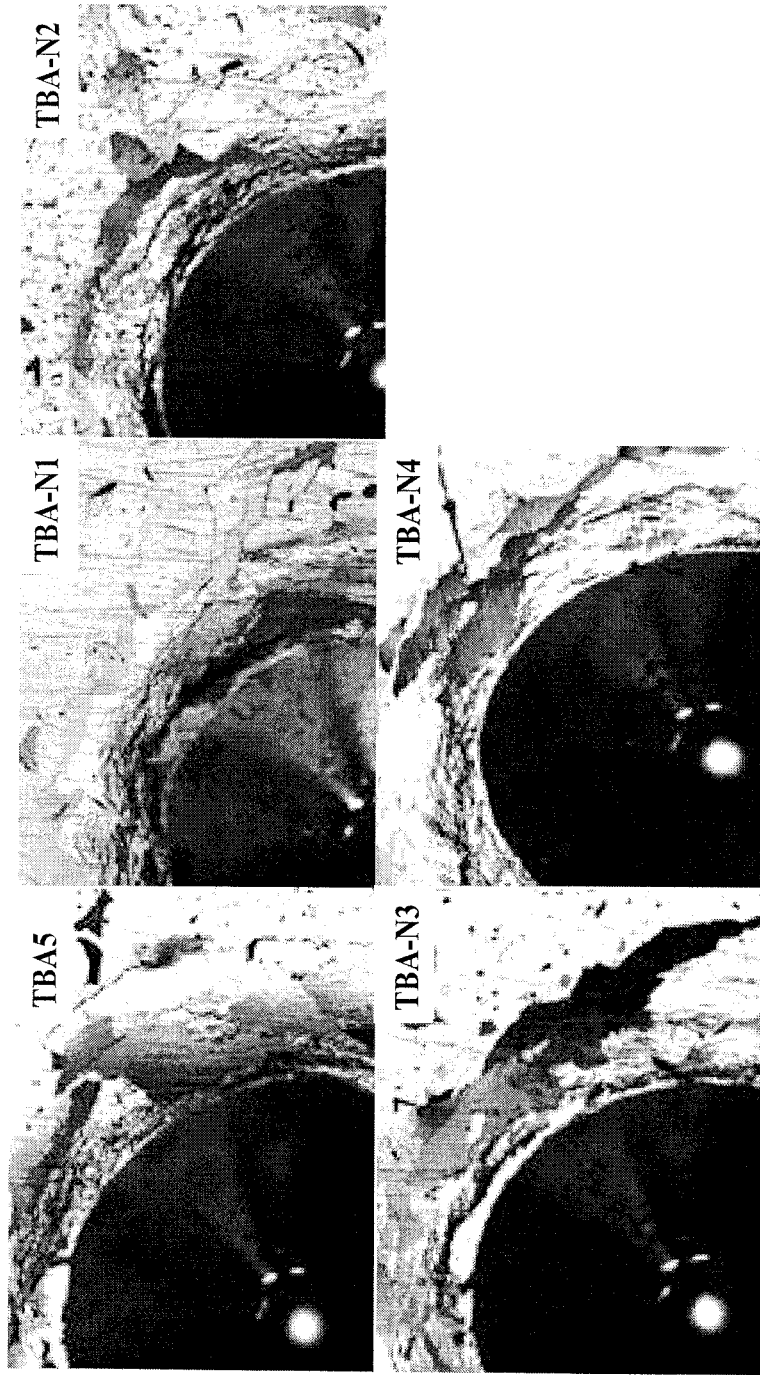

The results of this example are shown in FIGS. 28 to 30. Based upon these results it is apparent a Ti base layer between the $TiB_2$—Al coating and the stainless steel press plate is desirable. While the inclusion of the Ti base layer may result in slightly reduced hardness, the enhanced adhesion characteristics when using a Ti base layer dictate the desirability of the use of a Ti base layer in the manufacture of a coated press plate in accordance with the present invention.

Example 3

A $TiB_2$—Al coating was applied via the magnetron sputtering system in accordance with the following conditions (Table 3) with the substrate bias varied:

TABLE 3

| Substrate (Sub.) | Silicon (Si)(100), Stainless Steel (SS) |
|---|---|
| Target | $TiB_2 \times 2$, Al $\times$ 1 |
| Target power (DC) | $TiB_2$: 200 W $\times$ 2 |
| | Al: 5 W (resulting in a $TiB_2$—Al coating with 2% Al) |
| Substrate bias (RF) | Floating, −30 V, −60 V, −90 V, −120 V |
| Working pressure | (8 $\times$ 10$^{-3}$ torr) |

TABLE 3-continued

| Reactive gas | Ar (40 sccm) |
|---|---|
| Deposition time | 2 hr |
| Substrate Temperature | 200° C. |
| Substrate rotation | 5 rpm |

The results of this example are shown in FIGS. 31 to 40, and support the conclusion to use a substrate bias of 60-90 V and at a temperature of 200° C. in accordance with the fabrication of coated press plates in accordance with the present invention.

Example 4

A $TiB_2$—Al coating was applied via the magnetron sputtering system in accordance with the following conditions (Table 4) with the nitrogen doping at various levels:

TABLE 4

| Substrate (Sub.) | Silicon (Si)(100), Stainless Steel (SS) |
|---|---|
| Target | $TiB_2 \times 2$, Al $\times$ 1 |
| Target power (DC) | $TiB_2$: 200 W $\times$ 2 |
| | Al: 5 W (resulting in a $TiB_2$—Al coating with 2% Al) |
| Substrate bias (RF) | −60 V |
| Working pressure | (8 $\times$ 10$^{-3}$ torr) |
| Reactive gas | Ar (40 sccm) |
| | $N_2$ (1, 2, 3, 4 sccm) |
| Deposition time | 2 hr |
| Substrate temperature | 200° C. |
| Substrate rotation | 5 rpm |

The results of this example are shown in FIGS. 41 to 47, and dictate the conclusion that nitrogen doping is not desirable when fabricating coated press plates in accordance with the present invention.

Figure 48:
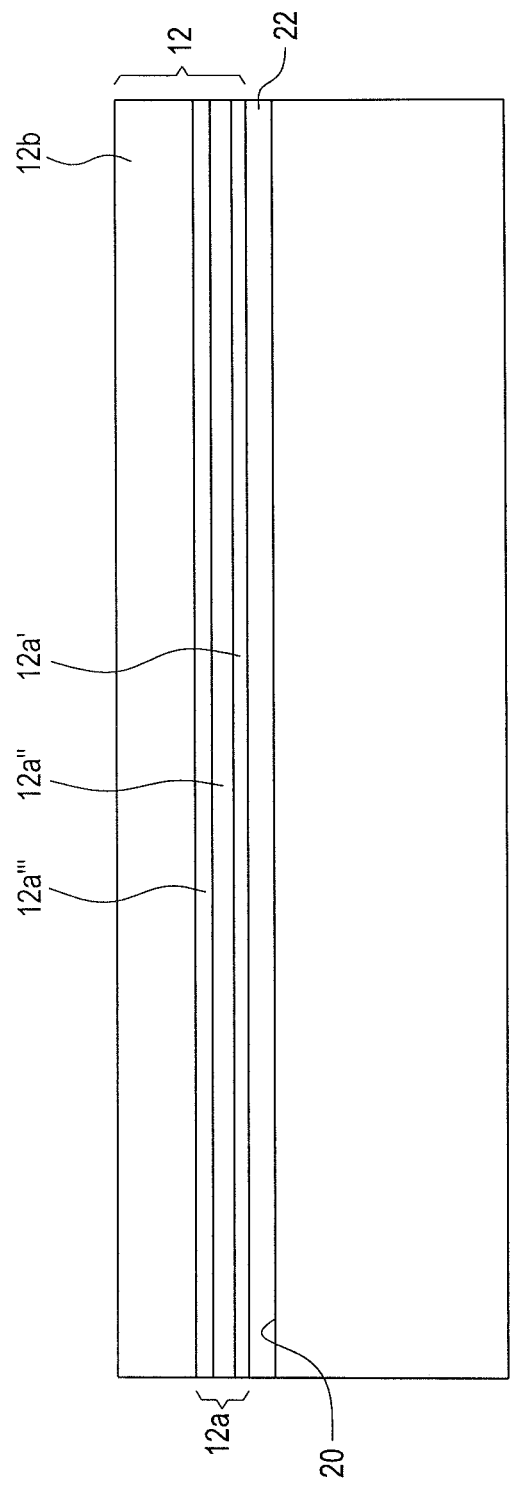
FIG. 48 is a schematic of an embodiment of a coated press plate in accordance with the present invention.

Based upon the results of Examples 1-4, the following preferred criteria, as shown with reference to FIG. 48, for the application of the $TiB_2$—Al coating 12 have been established. First, the stainless steel press plate 10 (preferably, composed high gloss 410 stainless steel) is prepared for the application of the $TiB_2$—Al coating 12. The pressing side 20 of the stainless steel press plate 10, that is, the side of the press plate 10 to which the $TiB_2$—Al coating 12 is to be applied, is thoroughly cleaned and etched. Thereafter, a base layer of titanium 22, preferably with a thickness of 300 nm is applied directly onto the pressing side 20 of the stainless steel press plate 10 via the magnetron sputtering system 100.

The $TiB_2$—Al coating 12 is then applied. The $TiB_2$—Al coating 12 is applied in a two-stage process composed of a gradient based $TiB_2$—Al coating layer 12a and top $TiB_2$—Al coating layer 12b. The gradient based $TiB_2$—Al coating layer 12a is preferably 600 nm in thickness. The target power of 200 W$\times$2 for the $TiB_2$ is used in conjunction with a sequentially increased target power of 5 W$\times$1, 7 W$\times$1 & 10 W$\times$1 for the Al. As such, the gradient based $TiB_2$—Al coating layer 12a will have a 200 nm thickness layer of $TiB_2$—Al 12a' applied at a target power of 200 W$\times$2 for the $TiB_2$ and a target power of 5 W$\times$1 for the Al, a 200 nm thickness layer of $TiB_2$—Al 12a'' applied at a target power of 200 W$\times$2 for the $TiB_2$ and a target power of 7 W$\times$1 for the Al, a 200 nm thickness layer of $TiB_2$—Al 12a''' applied at a target power of 200 W$\times$2 for the $TiB_2$ and a target power of 10 W$\times$1 for the Al, The $TiB_2$—Al coating layer 12a is preferably applied with a substrate bias of 60-90 V and at a temperature of 200° C.

The top TiB$_2$—Al coating layer 12b is preferably 1,240 nm in thickness. The top TiB$_2$—Al coating layer 12b is applied at a target power of 200 W×2 for the TiB$_2$ and a target power of 5 W×1 for the Al to product a top TiB$_2$—Al coating layer 12b with 2%-3% by weight Al. The top TiB$_2$—Al coating layer 12b is preferably applied with a substrate bias of 60-90 V and at a temperature of 200° C.

While high hardness is achieved it is found that poor adhesion for the TiB$_2$—Al coating may be encountered. In deciding upon a desired hardness, and ultimately ranges for the operating parameters discussed above, it should be appreciated that hardness must be balanced with the desire to protect the press plate from protection against grit, which has a Vickers hardness of at least 1,200 HV (11.77 GPa), and is preferably 1800 HV (17.65 GPa) to 2000 HV (19.61 GPa), contained in high pressure laminates being pressed as well as adhesion of the coating to the substrate wherein adhesion is known to increase when the coating is softer and thinner.

Enhanced adhesion is achieved by optimizing film crystallinity and preferred orientation, reducing grain sizes, and providing solid solution induced film compressive stress. As the examples above demonstrate, doping a few percent of Al in TiB$_2$—Al reduces grain size (FESEM (Field Emission Scanning Electron Microscope) and XRD (FWHM (Full width at half maximum)), enhance TiB$_2$ (001) texture, Al atoms substitute Ti or B to form solid solution, and increases film compressive stress. It was found that approximately 2% Al in TiB$_2$ makes the hardest films of 46 GPa, but with the highest stress and poor adhesion, while at 9% to 12% Al in TiB$_2$ the coating was found to have only moderate hardness of 15 GPa to 30 GPa and better adhesion level. This is believed to result from amorphous structure and low film stress (transition from compressive to tensile). It has further been found that a gradient TiB$_2$—Al film or intermediate metal Ti layer is effective to improve film adhesion.

In addition, to those operating criteria disclosed above, it is preferred that the magnetron sputtering system 100 be operated under the following conditions: a working pressure of 8×10$^{-3}$ torr and reactive gas of Ar (40 sccm). With regard to the scan rate, it is appreciated the scan rate when will be determined so as to curtail temperature gradient within the substrate.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A coated stainless steel press plate manufactured in according with the method comprising:
preparing the stainless steel press plate for coating;
coating the stainless steel press plate with a titanium diboride doped with 1%-5% by weight aluminum to produce a diboride-aluminum coating, wherein coating consists of applying the titanium diboride using a first applicator consisting of titanium diboride of a magnetron sputter coating system and simultaneously doping the titanium diboride with 1%-5% by weight aluminum by applying aluminum using a second applicator consisting of aluminum of the magnetron sputter coating system producing the diboride-aluminum coating consisting of the titanium diboride and the aluminum upon the stainless steel press plate.

2. The coated stainless steel press plate according to claim 1, wherein the stainless steel press plate is a 410 stainless steel high gloss press plates.

3. The coated stainless steel press plate according to claim 1, wherein the stainless steel press plate is a 300 stainless steel press plate, a 410 stainless steel press plate, a 420 stainless steel press plate, a 630 stainless steel press plate, or a 633 stainless steel press plate.

4. The coated stainless steel press plate according to claim 1, wherein the titanium diboride-aluminum coating has a Vickers hardness of at least 35 GPa.

5. The coated stainless steel press plate according to claim 4, wherein the titanium diboride-aluminum coating has a Vickers hardness of 46 GPa.

6. The coated stainless steel press plate according to claim 1, wherein the titanium diboride-aluminum coating has a thickness of about 3 microns.

7. The coated stainless steel press plate according to claim 1, wherein the titanium diboride-aluminum coating is applied at a substrate bias of 60-90 V and at temperature of 200° C.

8. The coated stainless steel press plate according to claim 1, wherein the titanium diboride-aluminum coating has a minimum bond strength of 1.6 kilogram force.

9. The coated stainless steel press plate according to claim 8, wherein the titanium diboride-aluminum coating has a minimum bond strength of 1.8 kilogram force.

10. The coated stainless steel press plate according to claim 1, wherein preparing the stainless steel press plate includes cleaning a pressing side of the stainless steel press plate.

11. The coated stainless steel press plate according to claim 10, wherein preparing the stainless steel press plate includes etching the pressing side of the stainless steel press plate.

12. The coated stainless steel press plate according to claim 10, wherein preparing the stainless steel press plate includes applying a layer of titanium directly onto the pressing side of the stainless steel press plate.

* * * * *